(12) United States Patent
Jang

(10) Patent No.: US 11,581,248 B2
(45) Date of Patent: Feb. 14, 2023

(54) SEMICONDUCTOR PACKAGE

(71) Applicant: Samsung Electronics Co., Ltd., Suwon-si (KR)

(72) Inventor: Aenee Jang, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 126 days.

(21) Appl. No.: 17/224,549

(22) Filed: Apr. 7, 2021

(65) Prior Publication Data

US 2022/0077039 A1 Mar. 10, 2022

(30) Foreign Application Priority Data

Sep. 7, 2020 (KR) ........................ 10-2020-0113791

(51) Int. Cl.

| | |
|---|---|
| *H01L 23/498* | (2006.01) |
| *H01L 23/31* | (2006.01) |
| *H01L 23/538* | (2006.01) |
| *H01L 23/00* | (2006.01) |
| *H01L 25/18* | (2006.01) |

(52) U.S. Cl.
CPC .... *H01L 23/49816* (2013.01); *H01L 23/3171* (2013.01); *H01L 23/49822* (2013.01); *H01L 23/49838* (2013.01); *H01L 23/5383* (2013.01); *H01L 23/5386* (2013.01); *H01L 24/05* (2013.01); *H01L 24/16* (2013.01); *H01L 25/18* (2013.01); *H01L 2224/0401* (2013.01); *H01L 2224/16146* (2013.01); *H01L 2224/16147* (2013.01); *H01L 2224/16227* (2013.01); *H01L 2224/16235* (2013.01); *H01L 2224/16238* (2013.01); *H01L 2924/1431* (2013.01); *H01L 2924/1434* (2013.01)

(58) Field of Classification Search
CPC combination set(s) only.
See application file for complete search history.

(56) References Cited

U.S. PATENT DOCUMENTS

| | | | |
|---|---|---|---|
| 9,520,333 B1 * | 12/2016 | Shih | .................... H01L 23/3128 |
| 9,728,511 B2 | 8/2017 | Wu et al. | |
| 10,083,915 B2 | 9/2018 | Kim et al. | |
| 10,103,109 B2 | 10/2018 | Kim et al. | |

(Continued)

FOREIGN PATENT DOCUMENTS

| | | |
|---|---|---|
| JP | 2009044020 A | 2/2009 |
| WO | 2014036976 A1 | 3/2014 |

*Primary Examiner* — Douglas W Owens
(74) *Attorney, Agent, or Firm* — Myers Bigel, P.A.

(57) ABSTRACT

A semiconductor package includes a base substrate; an interposer substrate including a semiconductor substrate having a first surface facing the base substrate and a second surface, opposing the first surface, and a passivation layer on at least a portion of the first surface; a plurality of connection bumps between the base substrate and the interposer substrate; an underfill resin in a space between the base substrate and the interposer substrate; and a first semiconductor chip and a second semiconductor chip on the interposer substrate. The interposer substrate has a first region, in which the plurality of connection bumps are included, and a second region and a third region adjacent a periphery of the first region, and the passivation layer is in the second region and includes a first embossed pattern in the second region.

20 Claims, 22 Drawing Sheets

(56) References Cited

U.S. PATENT DOCUMENTS

| | | |
|---|---|---|
| 10,559,543 B2 | 2/2020 | Kim et al. |
| 2008/0169533 A1 | 7/2008 | Jeng et al. |
| 2012/0018875 A1 | 1/2012 | Yang et al. |
| 2014/0070406 A1 | 3/2014 | Mohammed et al. |
| 2018/0040548 A1* | 2/2018 | Kim .................... H01L 21/4857 |
| 2018/0053723 A1* | 2/2018 | Hu ........................ H01L 21/486 |
| 2019/0096849 A1 | 3/2019 | Woychik et al. |
| 2020/0020604 A1 | 1/2020 | Kim et al. |
| 2021/0210360 A1* | 7/2021 | Kang ................... H01L 23/562 |

\* cited by examiner

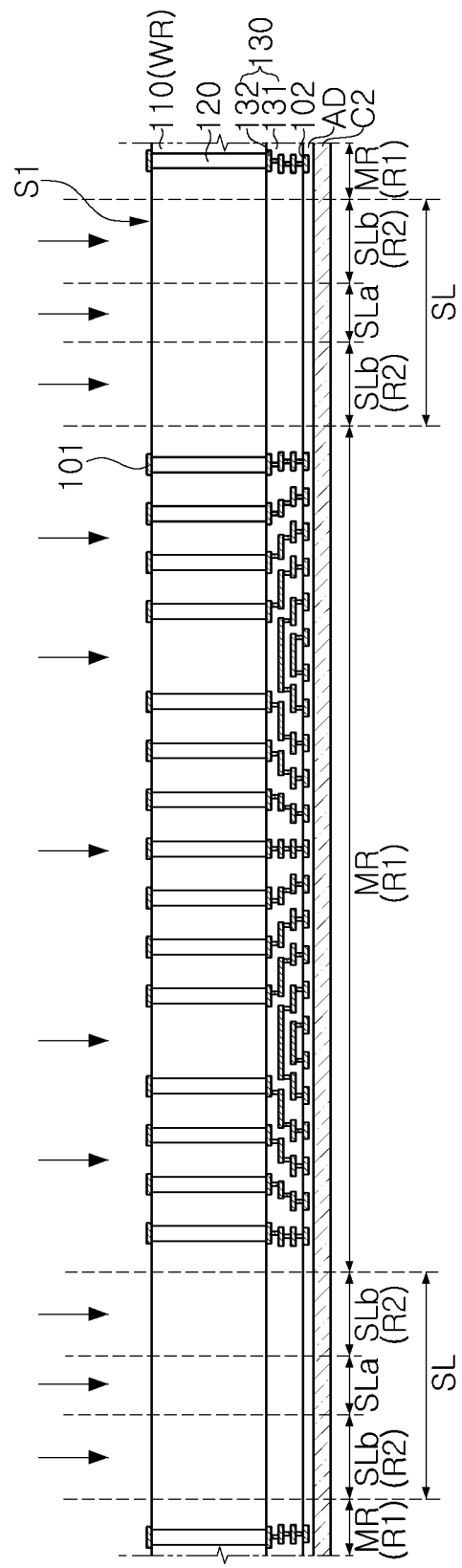

SEMICONDUCTOR PACKAGE

CROSS-REFERENCE TO RELATED APPLICATION(S)

This application claims benefit of priority to Korean Patent Application No. 10-2020-0113791 filed on Sep. 7, 2020 in the Korean Intellectual Property Office, the disclosure of which is incorporated herein by reference in its entirety.

FIELD

The present disclosure relates to a semiconductor package.

BACKGROUND

A system in package (SIP) technique for embedding a plurality of semiconductor chips in a single package has been developed. An interposer substrate, having a through-silicon via (TSV), has been used to form fine interconnections connecting semiconductor chips to each other in a package.

SUMMARY

Example embodiments provide a semiconductor package having improved reliability.

According to an example embodiment, a semiconductor package includes: a base substrate including a first interconnection structure; an interposer substrate including a semiconductor substrate having a first surface facing the base substrate and a second surface opposing the first surface, an interconnection region on the second surface and including a second interconnection structure, a through-via extending through the semiconductor substrate electrically connecting the second interconnection structure to the first interconnection structure, and a passivation layer on at least a portion of the first surface; a plurality of connection bumps between the base substrate and the interposer substrate and electrically connecting the through-via to the first interconnection structure; an underfill resin in a space between the base substrate and the interposer substrate; and a first semiconductor chip and a second semiconductor chip on the interconnection region of the interposer substrate and electrically connected to each other by the second interconnection structure. The interposer substrate has a first region, in which the plurality of connection bumps are included, and a second region and a third region adjacent a periphery of the first region, and the passivation layer is in the second region and includes a first embossed pattern in the second region.

According to an example embodiment, a semiconductor package includes: an interposer substrate having a first region including a plurality of through-vias, a second region adjacent a periphery of the first region, and a third region adjacent a periphery of the second region; a passivation layer on a first surface of the interposer substrate in the second region, where a surface of the passivation layer includes a first embossed pattern in the second region; and a plurality of semiconductor chips on a second surface of the interposer substrate. The second region is spaced apart from an edge of the interposer substrate, and the third region is between the second region and the edge of the interposer substrate.

According to an example embodiment, a semiconductor package includes: an interposer substrate including a semiconductor substrate having a first surface and a second surface opposing the first surface, an interconnection region on the second surface and including an interconnection structure, a plurality of bump pads on the first surface, a plurality of dummy patterns adjacent a periphery of the plurality of bump pads on the first surface, a plurality of through-vias extending through the semiconductor substrate and electrically connecting the interconnection structure to the plurality of bump pads, and a passivation layer on the plurality of bump pads and the plurality of dummy patterns; and a first semiconductor chip and a second semiconductor chip on the interposer substrate and electrically connected to each other by the interconnection structure. The passivation layer is spaced apart from an edge of the interposer substrate by a predetermined distance and has an embossed pattern that is curved along surfaces of the plurality of dummy patterns.

BRIEF DESCRIPTION OF DRAWINGS

The above and other aspects, features, and advantages of the present disclosure will be more clearly understood from the following detailed description, taken in conjunction with the accompanying drawings.

FIGS. 9A to 9G are schematic cross-sectional views illustrating a method of manufacturing some components in the semiconductor package of FIG. 1B.

DETAILED DESCRIPTION

Hereinafter, example embodiments will be described with reference to the accompanying drawings.

Figure 1A:
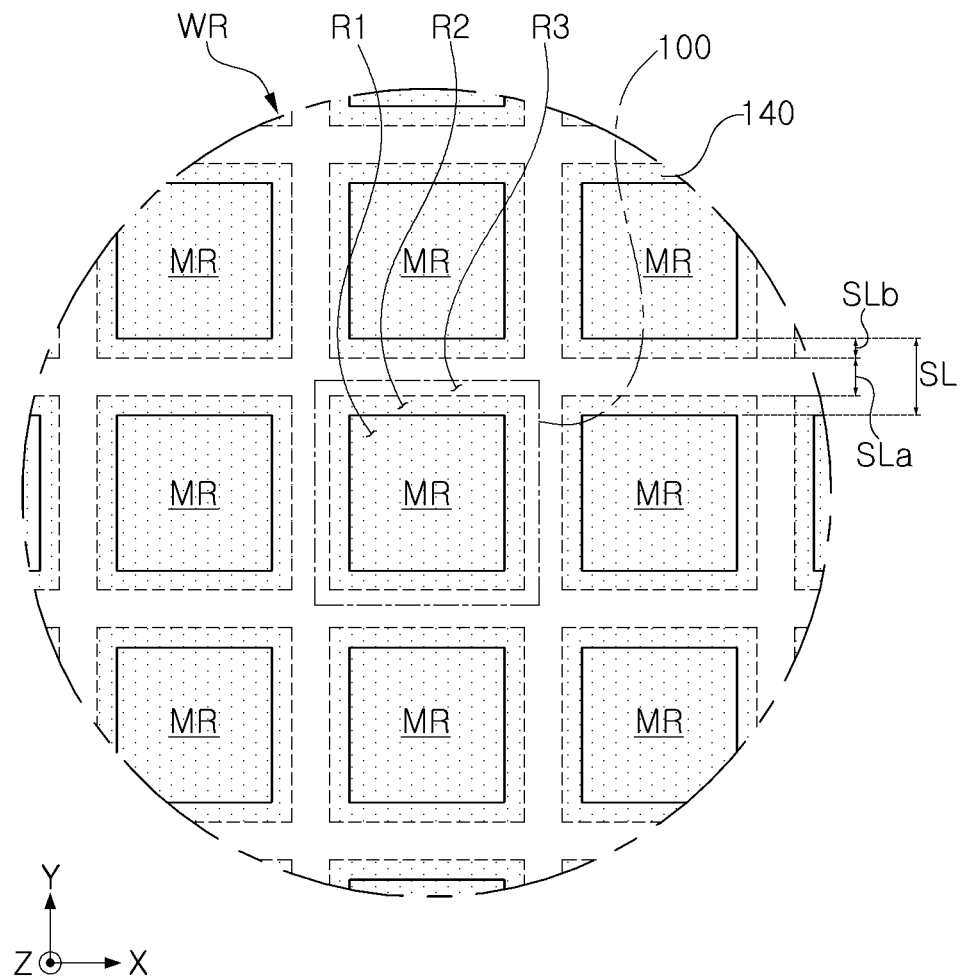
FIG. 1A is a plan view illustrating a portion of a wafer for manufacturing an interposer substrate for a semiconductor package according to an example embodiment.
Figure 1B:
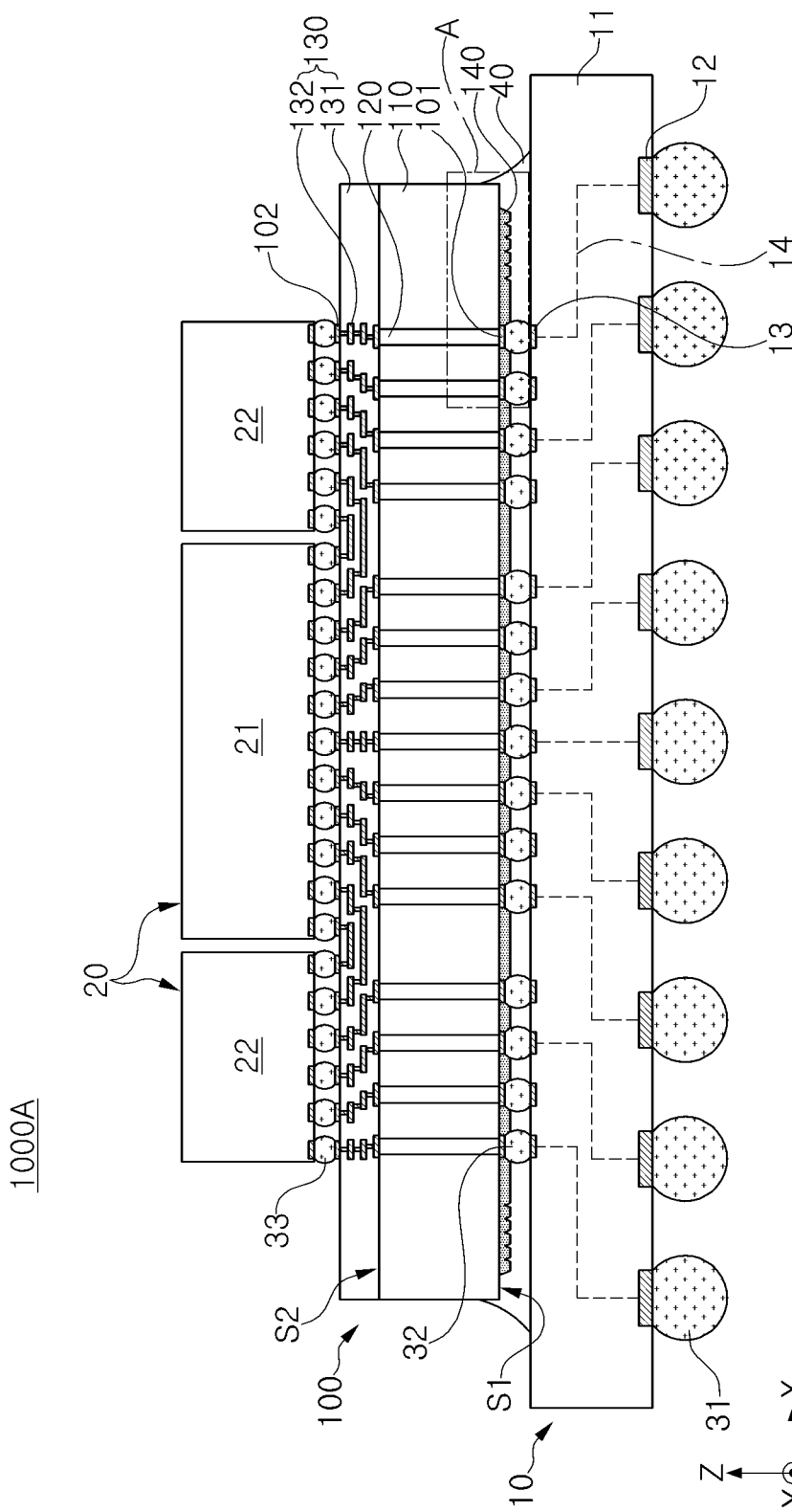
FIG. 1B is a cross-sectional view of a semiconductor package according to an example embodiment.
Figure 1C:
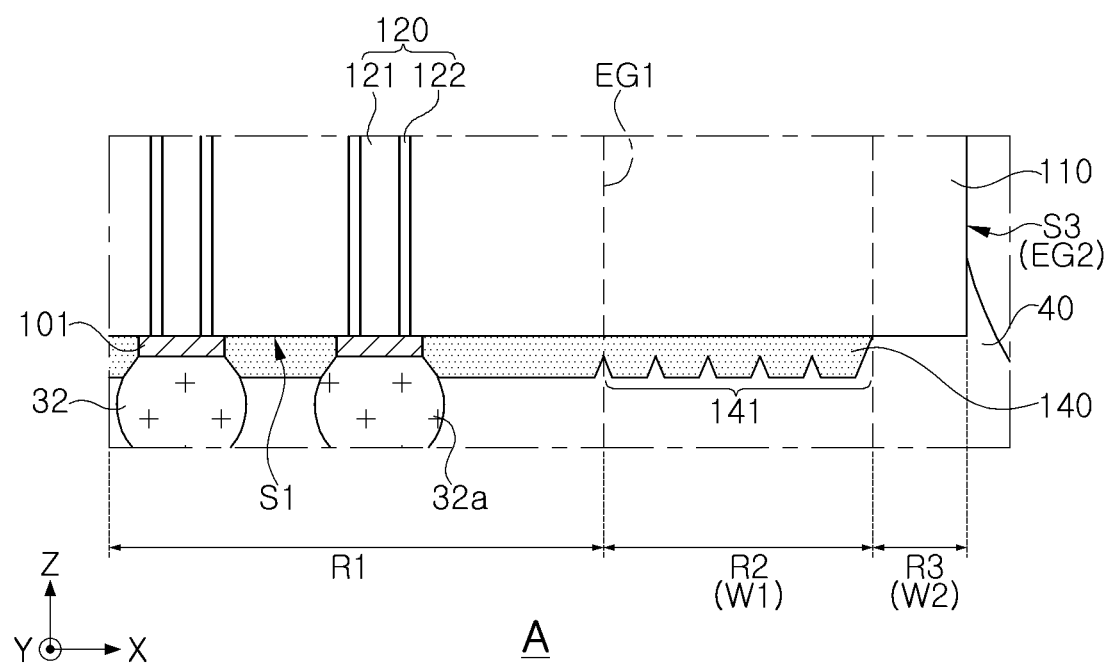
FIG. 1C is a partially enlarged view of region "A" of FIG. 1B.
Figure 1D:
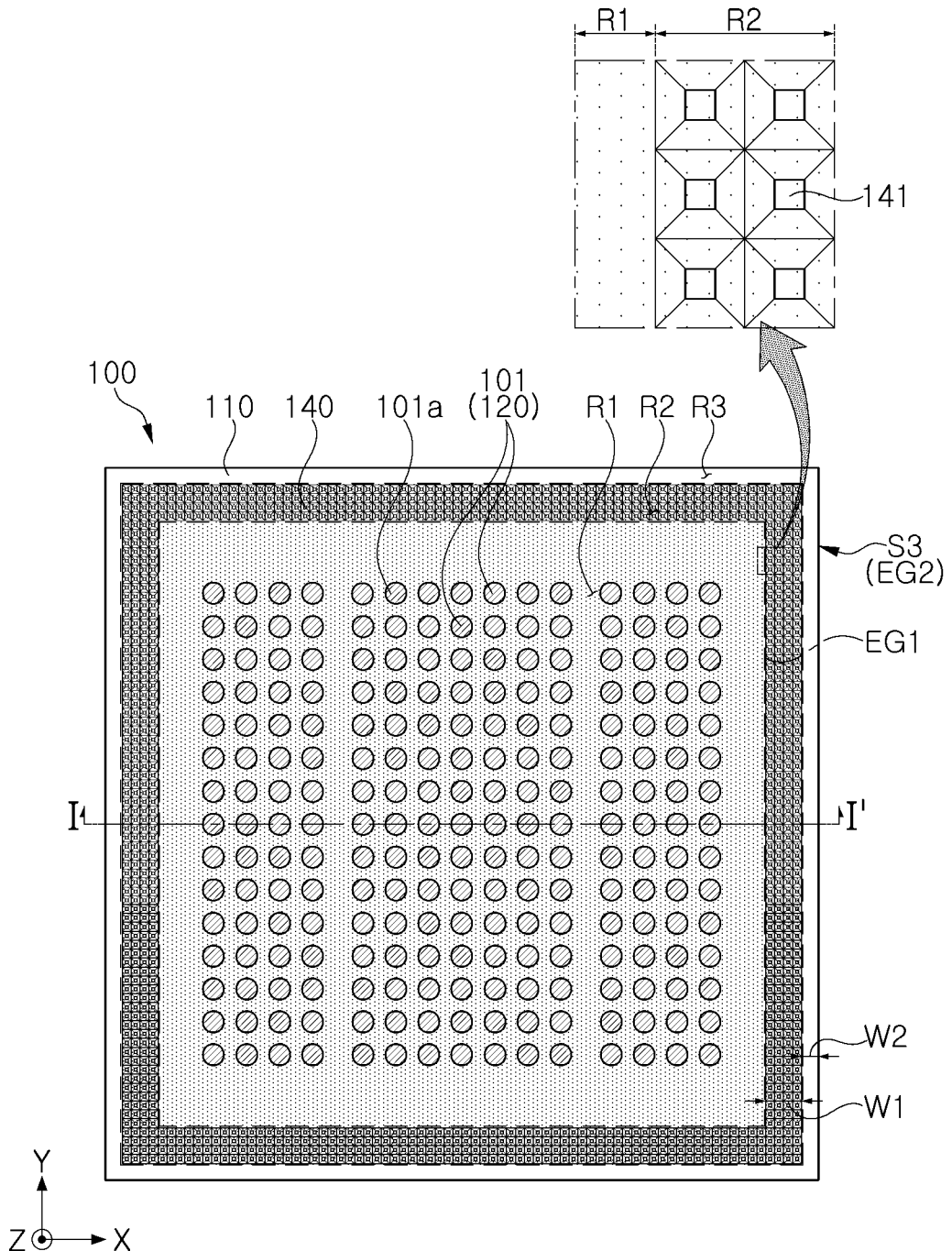
FIG. 1D is a plan view illustrating a lower surface of the interposer substrate of FIG. 1B.
Figure 1E:
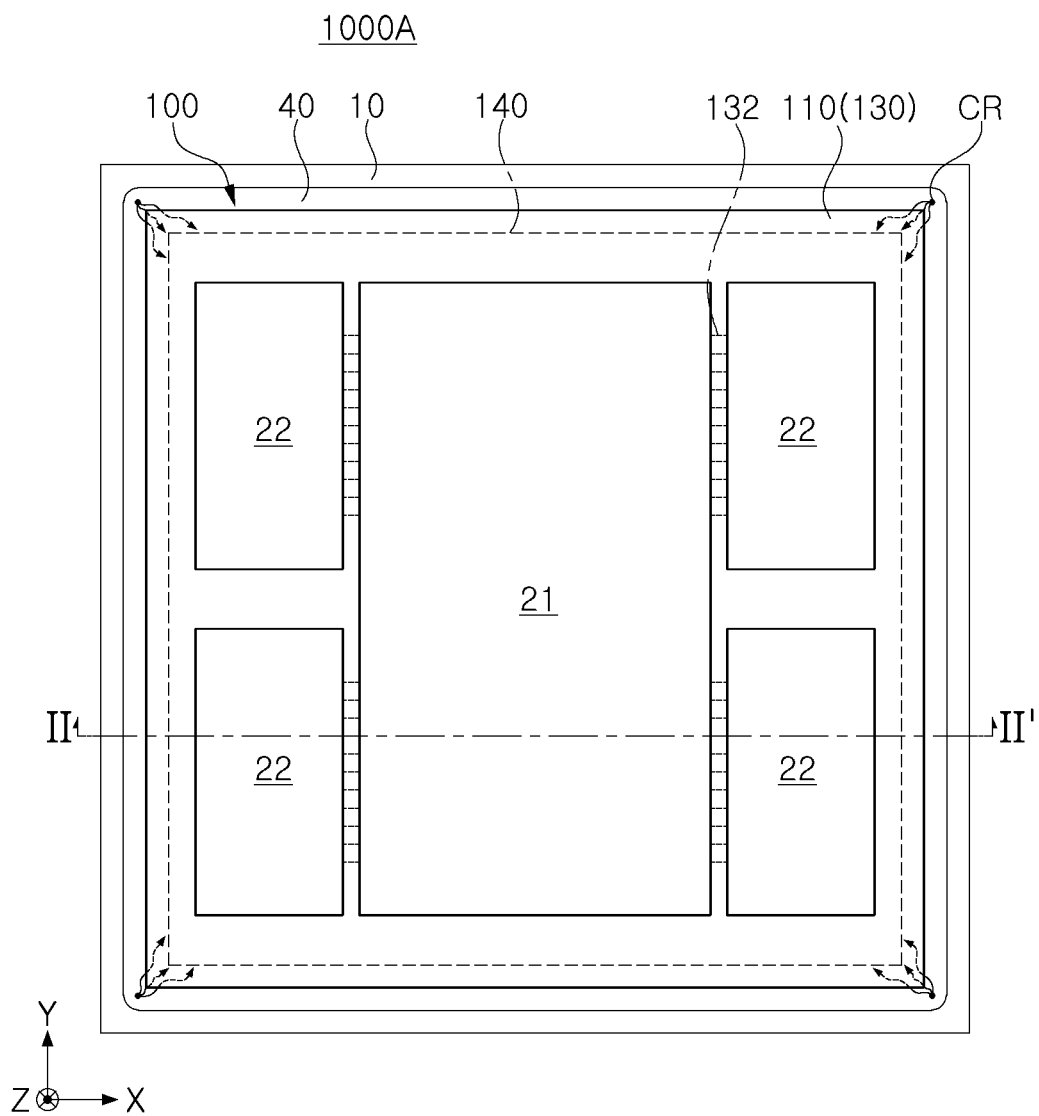
FIG. 1E is a plan view illustrating a propagation path of cracking occurring in the semiconductor package of FIG. 1B.
Figure 1F:
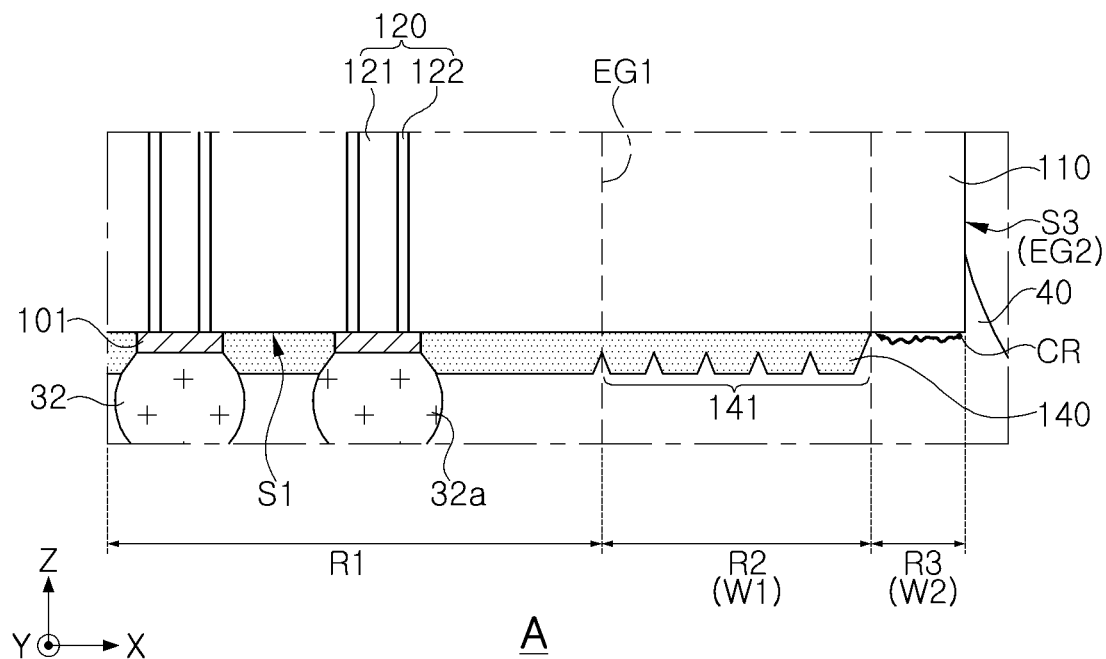
FIG. 1F is a cross-sectional view illustrating a propagation path of cracking occurring in the semiconductor package of FIG. 1B.

FIGS. 1A to 1F are views illustrating a semiconductor package 1000A according to an example embodiment. FIG. 1A is a plan view illustrating a portion of a wafer WR for manufacturing an interposer substrate 100 for a semiconductor package according to an example embodiment, FIG. 1B is a cross-sectional view of a semiconductor package 1000A according to an example embodiment, and FIG. 1C is a partially enlarged view of region "A" of FIG. 1B. FIG. 1D is a plan view illustrating a lower surface of the interposer substrate 100 of FIG. 1B, and FIGS. 1E and 1F are a plan view and a cross-sectional view illustrating a propagation path of cracking occurring in the semiconductor package 1000A of FIG. 1B, respectively. The interposer substrate of FIG. 1B illustrates a vertical cross section taken along line I-I' of FIG. 1D. The semiconductor package 1000A of FIG. 1B illustrates a vertical cross section taken along line of FIG. 1E.

Referring to FIG. 1A, the wafer WR for manufacturing the interposer substrate 100 may include a plurality of main regions (or chip regions) MR and scribe lane regions or areas SL. Each of the plurality of main regions MR may include a region in which a plurality of through-silicon vias are formed. The plurality of main regions MR may be spaced apart from each other by the scribe lane area SL.

The scribe lane region SL may be a region along which the wafer WR is diced during a sawing process to separate individual interposer substrates 100 from each other after a process of manufacturing the main region MR on the wafer WR is completed. The scribe lane region SL may include a touch region SLa and a non-touch region SLb. The touch region SLa is in contact with the sawing blade in the sawing process, while the non-touch region SLb is not in contact with the sawing blade in the sawing process. The non-touch region SLb may be a margin region in consideration of a process error. In the sawing process, a portion of the touch region SLa may remain without being removed. Each of the interposer substrates 100, separated from each other by the sawing process, may include a region of the touch region SLa partially remaining around the non-touch region SLb. Accordingly, the interposer substrate 100 may include a first region R1 corresponding to the main region MR, a second region R2 corresponding to the non-touch region SLb, and a third region R3, the region of the touch region SLa remaining after the sawing process. The terms "first," "second," etc. are used herein merely to distinguish one element or region from another. The main region MR and the non-touch region SLb may be covered with a passivation layer 140. As used herein, an element or region that is "covering" or "surrounding" or "filling" another element or region may completely or partially cover or surround or fill the other element or region.

For example, a width of the scribe lane region SL may be within the range of about 300 micrometers (μm) to 350 μm, and a width of the sawing blade may be within the range of about 40 μm to 60 μm. A width of the touch region SLa may be within the range of about 80 μm to 100 μm, and a width of the non-touch region SLb may be within the range obtained by subtracting the width of the touch region SLa from the width of the scribe lane region SL. A width of the region R3 remaining after the sawing process of the touch region SLa may be about 10 μm or more.

Referring to FIG. 1B, the semiconductor package 1000A may include a base substrate 10, an interposer substrate 100, a plurality of semiconductor chips 20, a plurality of connection bumps 31, 32, and 33, and an underfill a resin 40.

The base substrate 10 may include a substrate body 11, pads 12 and 13, respectively disposed on a lower surface and an upper surface of the substrate body 11, and a first interconnection structure 14 electrically connecting the pads 12 and 13 to each other. The base substrate 10 may be configured as a support substrate on which the interposer substrate 100 and the semiconductor chips 20 are mounted, and may be configured as a substrate for a semiconductor package including a printed circuit board (PCB), a ceramic substrate, a glass substrate, and a tape wiring board.

The substrate body 11 may include various materials depending on the type of the base substrate 10. For example, when the base substrate 10 is a printed circuit board, the substrate body 11 may be configured as a copper clad laminate or a copper clad laminate including an interconnection layer stacked on a cross-sectional surface or both surfaces thereof. A lower protective layer and an upper protective layer, coated with a solder resist, may be formed on a lower surface and an upper surface of the substrate body 11, respectively.

The pads 12 and 13 and the first interconnection structure 14 may form an electrical path connecting the lower surface and the upper surface of the base substrate 10. The pads 12 and 13 and the first interconnection structure 14 may include an alloy including at least one metal or two or more metals, among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C). The first interconnection structure 14 may include a single interconnection layer or multiple interconnection layers, formed in the substrate 10, and a via connecting the interconnection layers to each other.

The plurality of semiconductor chips 20 may be mounted on the interposer substrate 100, and may be electrically connected to each other by a front side interconnection region 130 or the second interconnection structure 132 on the front side of the interposer substrate 100. The plurality of semiconductor chips 20 may include a first semiconductor chip 21 and a second semiconductor chip 22 including different types of integrated circuits. The first semiconductor chip 21 may include a logic chip such as a central processing unit (CPU), a graphics processing unit (GPU), a field programmable gate array (FPGA), a digital signal processor (DSP), a cryptographic processor, a microprocessor, a microcontroller, an analog-digital converter, or an application-specific integrated circuit (ASIC). The second semiconductor chip 22 may include a volatile memory device such as a dynamic random access memory (DRAM) or a static random access memory (SRAM), a nonvolatile memory device such as a phase-change random access memory (PRAM), a magnetic random access memory (MRAM), a resistive random access memory (RRAM), or a flash memory, or a high-performance memory device such as a high-bandwidth memory (HBM) or a hybrid memory cube (HMC).

The plurality of connection bumps 31, 32, and 33 may have a flip-chip connection structure having, for example, a solder ball, a conductive bump, or a grid array such as a pin grid array, a ball grid array, or a land grid array. The plurality of connection bumps 31, 32, and 33 may include an alloy including at least one metal or two or more metals, among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C). For example, the plurality of connection bumps 31, 32, and 33 may include an alloy including tin (Sn) (for example, Sn—Ag—Cu).

The first connection bump 31 on a lower surface of the base substrate 10 may physically and electrically connect the first interconnection structure 14 to an external device (for example, a mainboard). The second connection bump 32, disposed between the base substrate 10 and the interposer substrate 100, may physically and electrically connect a through-via 120 of the interposer substrate 100 and the first interconnection structure 14 of the base substrate 10 to each other. The third connection bump 33 on the lower surface of the semiconductor chip 20 may physically and electrically connect the semiconductor chip 20 and the second interconnection structure 130 of the interposer substrate 100 to each other. The first to third connection bumps 31, 32, and 33 may have different sizes. The first connection bump 31 may have a larger size than each of the second and third connection bumps 32 and 33, and the second connection bump 32 may have a larger size than the third connection bump 33.

The underfill resin 40 may partially or completely fill a space between the interposer substrate 100 and the base substrate 10, and may surround the second connection bumps 32. The underfill resin 40 may extend to an edge of the interposer substrate 100 to cover a portion of a side surface S3 of the interposer substrate 100. The underfill resin 40 may include an insulating polymer, for example, an epoxy resin. In a thermal cycle (TC) test of the package 1000A, cracking may occur in an edge portion and a corner portion of the underfill resin 40 surrounding the interposer substrate 100 (see FIGS. 1E and 1F). The cracking may propagate along the lower surface of the interposer substrate 100 and may cause interfacial delamination between the interposer substrate 100 and the underfill resin 40. In an example embodiment, an embossed pattern may be introduced into an edge of the passivation layer 140 on a back side of the interposer substrate 100 to reduce or prevent interfacial delamination between the interposer substrate 100 and the underfill resin 40 caused by the cracking.

The interposer substrate 100 may include the semiconductor substrate 110, the through-via 120, the interconnection region 130, and the passivation layer 140. A plurality of bump pads 101 and 102, with which the second and third connection bumps 32 and 33 are in contact, may be disposed on lower and upper surfaces of the interposer substrate 100, respectively. The bump pads 101 and 102 may be provided to be embedded in the lower and upper surfaces of the interposer substrate 100. In this case, the side surfaces of the bump pads 101 and 102 may be surrounded by an insulating layer formed of a silicon oxide, a silicon nitride, or a combination thereof. The bump pads 101 and 102 may include an alloy including at least one metal or two or more metals, among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

The semiconductor substrate 110 may be disposed on the base substrate 10, and may have a first surface S1, facing the base substrate 10, and a second surface S2 opposing the first surface S1. The semiconductor substrate 110 may be a semiconductor wafer. The semiconductor substrate 110 may include a semiconductor element such as silicon (Si) and germanium (Ge), or a compound semiconductor such as silicon carbide (SiC), gallium arsenide (GaAs), indium arsenide (InAs), and indium phosphide (InP). A bottom side or a back side of the semiconductor substrate 110 may be covered with an insulating layer formed of a silicon oxide, a silicon nitride, or a combination thereof.

The through-via 120 may be a through-silicon via (TSV) penetrating through the semiconductor substrate 110 in a vertical direction (a Z direction). The through-via 120 may provide an electrical path connecting the bump pads 101 and 102 on the lower and upper surfaces of the interposer substrate 100 to each other. The through-via 120 may electrically connect the second interconnection structure 130 on the interposer substrate 100 and the first interconnection structure 14 of the base substrate 10 to each other. The through-via 120 may include a conductive plug 121 and a barrier layer 122 surrounding the conductive plug 121. The conductive plug 121 may include a metal, for example, tungsten (W), titanium (Ti), aluminum (Al), or copper (Cu). The conductive plug 121 may be formed using a plating process, a physical vapor deposition (PVD) process, or a chemical vapor deposition (CVD) process. The barrier layer 122 may include an insulating barrier layer or/and a conductive barrier layer. The insulating barrier layer may include an oxide, a nitride, a carbide, a polymer, or combinations thereof. The conductive barrier layer may be disposed between the insulating barrier layer and the conductive plug 121. The conductive barrier layer may include, for example, a metal compound such as a tungsten nitride (WN), a titanium nitride (TiN), or a tantalum nitride (TaN). The barrier layer 122 may be formed using a PVD process or a CVD process.

The interconnection region 130 may be disposed on the top side or front side of the interposer substrate 100 or on the second surface S2 of the semiconductor substrate 110, and may include a first interlayer insulating layer 131 and a second interconnection structure 132. The first interlayer insulating layer 131 may be disposed on the second surface S2 of the semiconductor substrate 110, and may include a silicon oxide or a silicon nitride. The second interconnection structure 132 may interconnect the plurality of semiconductor chips 20 or may connect the plurality of semiconductor chips 20 to the base substrate 10. The second interconnection structure 132 may include a single-metal or multi-metal interconnection and a contact via. The contact via may connect the metal interconnections to each other, or may connect the metal interconnection and the upper bump pad 102 to each other. The second interconnection structure 132 may electrically and physically connect the through-via 120 and the upper bump pad 102 to each other.

The passivation layer 140 may be disposed on a bottom side or a back side of the interposer substrate 100, and may cover at least a portion of the first surface S1. The passivation layer 140 may cover the other portions of the interposer substrate 100, except for an edge of the interposer substrate 100. The passivation layer 140 may have an opening formed to expose a portion of the lower bump pad 101 of the interposer substrate 100, and the second connection bump 32 may be disposed in the opening. In an example embodiment, an embossed pattern may be formed on the edge of the passivation layer 140 to reduce or prevent cracking, occurring in the underfill resin 40, from propagating along a lower surface of the interposer substrate 100. The passivation layer 140 may include an insulating polymer, for example, photosensitive polyimide (PSPI).

Referring to FIGS. 1A and 1B together with FIG. 1C, in the semiconductor package 1000A, the interposer substrate 100 may have a first region R1, in which a plurality of connection bumps 32 are included, and a second region R2 and a third region R3 outside or adjacent a periphery of the first region R1, which may be free of the connection bumps 32. The passivation layer 140 may be disposed in the first region R1 and the second region R2, and may include a first embossed pattern 141 in the second region R2. The second and third regions R2 and R3 may be or correspond to the scribe lane regions SL before the sawing process. A width W1 of the second region R2 may be greater than a width W2 of the third region R3. The third region R3 may be within the range of a first distance corresponding to the width W2 from the edge EG2 of the interposer substrate 100. A first distance corresponding to the width W2 may be about 10 μm or more, for example, in the range of 10 μm to 50 μm.

The first surface S1 of the semiconductor substrate 110, corresponding to the third region R3, or the lower surface of the interposer substrate 100 may be in direct contact with the underfill resin 40, and may be free of the passivation layer 140. As used herein, when a layer or element is referred to as "directly" or "immediately" on or contacting or adjacent another layer or element, no intervening layers or elements are present. During the TC test, cracking occurring in the edge of the underfill resin 40 may cause interfacial delamination between the underfill resin 40 and the interposer substrate 100 along the first surface S1 of the semiconductor substrate 100, corresponding to the third region R3, and the lower surface of the interposer substrate 100. In addition, when the cracking propagates to an outermost connection bump 32a, among the plurality of connection bumps 32, or inwardly of the first region R1, connection reliability of the interposer substrate 100 may be deteriorated.

In an example embodiment, the first embossed pattern 141 of the passivation layer 140 may be brought into direct contact with the underfill resin 40 to reduce or prevent the interfacial delamination caused by the cracking. In addition, the cracking may be reduced or prevented from propagating to the outermost bump 32a of the first region R1 to secure connection reliability of the interposer substrate 100. A height of the passivation layer 140 for reducing or preventing the cracking may be about 1 μm or more. For example, the height of the passivation layer 140 may be within range of 1 μm to 5 μm. The height of the passivation layer 140 may refer to a height (i.e., along the vertical or Z-direction) from the first surface S1 of the semiconductor substrate 100 to a convex portion of the embossed pattern 141.

Referring to FIGS. 1B and 1C together with FIG. 1D, in the semiconductor package 1000A, the interposer substrate 100 may have a first region R1 including a plurality of through-vias 120 arranged in a matrix format, a second region R2 adjacent a periphery of or continuously surrounding the first region R1, and a third region R3 adjacent a periphery of or continuously surrounding the second region R2. The second region R2 may be disposed to surround an edge or boundary EG1 of the first region R1. The passivation layer 140 may be disposed on one surface of the interposer substrate 100, and may cover the first region R1 and the second region R2. The first embossed pattern 141 may be disposed on a surface of the passivation layer 140 in the second region R2. The first embossed pattern 141 may include a plurality of dot structures arranged in the second region R2. The second region R2 may be spaced apart from an edge EG2 of the interposer substrate 100 by the third region R3. A plurality of semiconductor chips 20 may be disposed on the other surface of the interposer substrate 100. The lower bump pads 101, illustrated in FIG. 1D, may define locations of corresponding through-vias 120, respectively.

Referring to FIGS. 1E and 1F, a cracking propagation path may be confirmed in the semiconductor package 1000A according to an example embodiment. During the TC test, cracking CR occurring outside of the underfill resin 40 may propagate to the first region R1 along the lower surface of the interposer substrate 100. The embossed pattern 141, formed in an edge of the passivation layer 140, may be in direct contact with the underfill resin 40 to prevent propagation of the cracking CR. The embossed pattern 141 may be adjacent a periphery of or surround the main region or the first region R1 of the interposer substrate 100, and may reduce or prevent damage to the interposer substrate 100 caused by the cracking CR.

Figure 2:
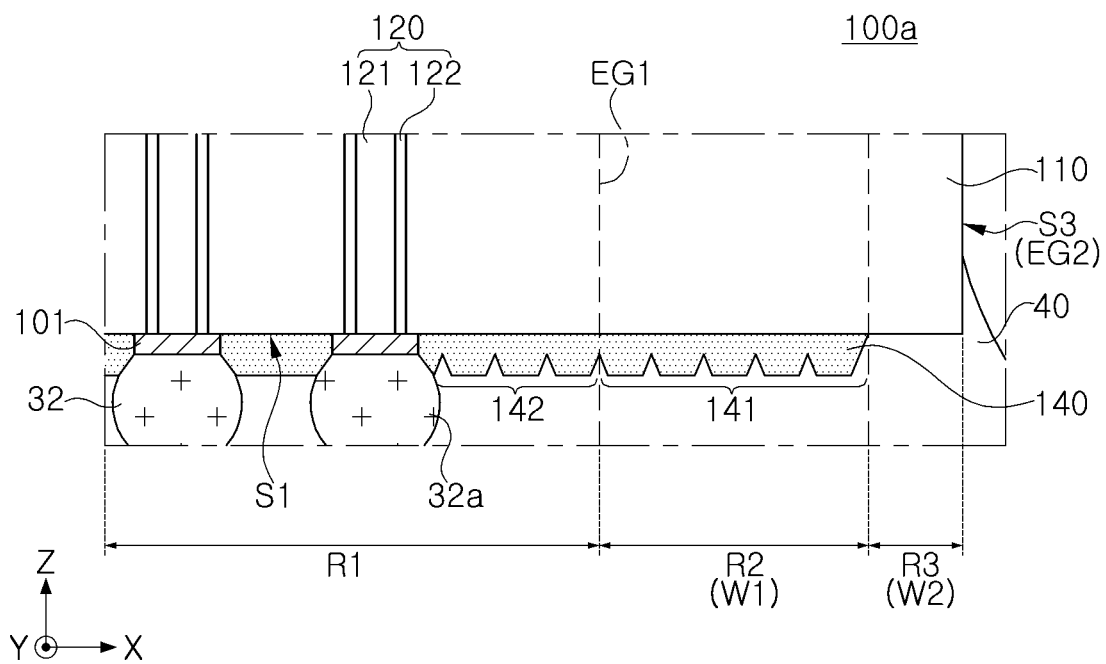
FIG. 2 is a cross-sectional view illustrating a modified example of some components in the semiconductor package of FIG. 1B.

FIG. 2 is a cross-sectional view illustrating a modified example of some components in the semiconductor package 1000A of FIG. 1B. FIG. 2 illustrates a modified example of the interposer substrate 100 in the semiconductor package 1000A of FIG. 1B.

Referring to FIG. 2, a modified interposer substrate 100a may include a passivation layer 140 that further includes a second embossed pattern 142. An edge or boundary EG1 of a first region R1 may be spaced apart from an outermost connection bump 32a, among a plurality of connection bumps 32, by a predetermined distance. The passivation layer 140 may further include a second embossed pattern 142 between the edge or boundary EG1 of the first region R1 and the outermost connection bump 32a, that is, between the second region R2 and the outermost connection bump 32a. The second embossed pattern 142 may further increase a contact area with the underfill resin 40. In addition, the second embossed pattern 142 may reduce or prevent damage to the outermost connection bump 32a caused by cracking.

Figure 3A:
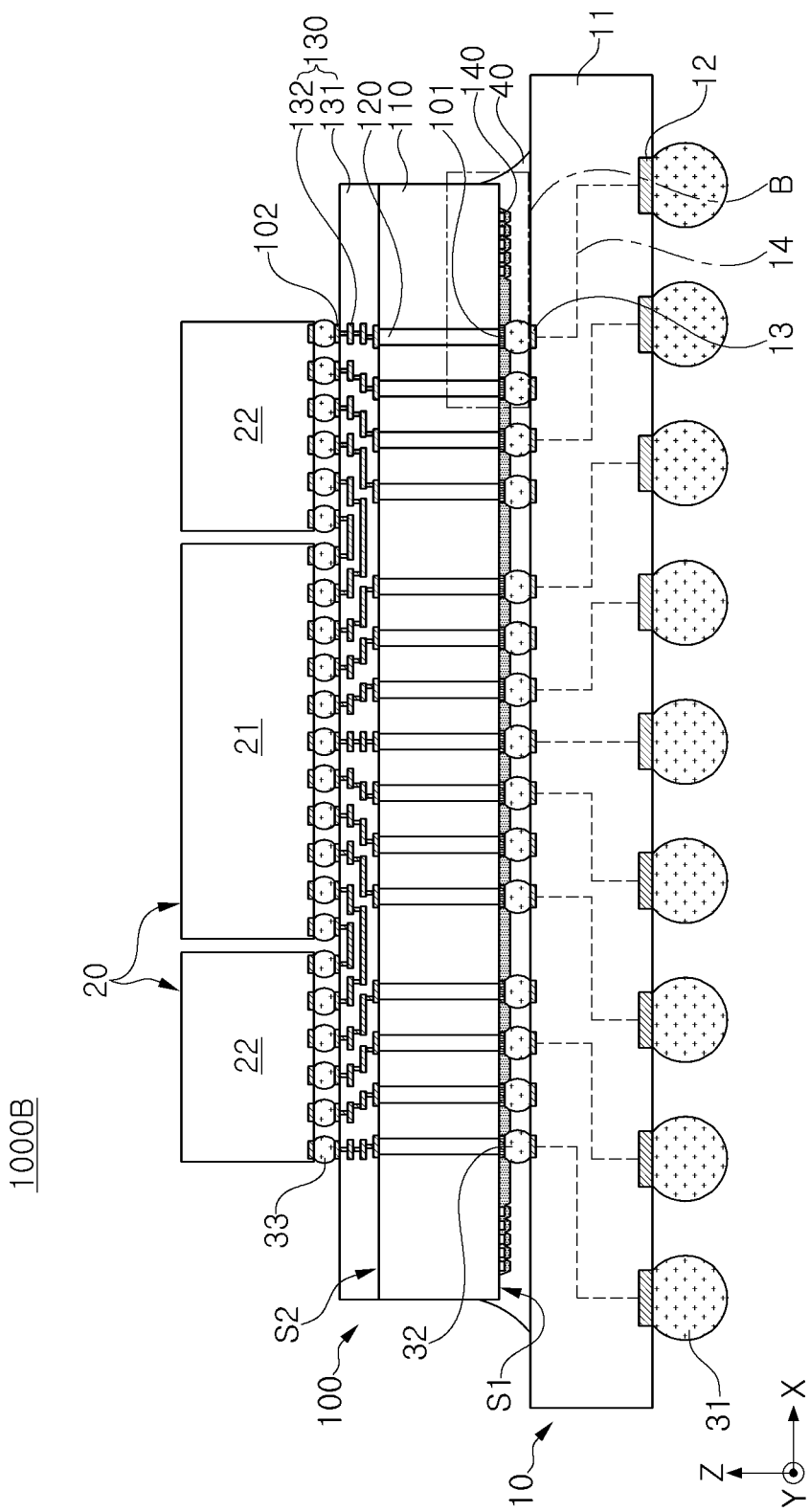
FIGS. 3A and 3B are cross-sectional views of a semiconductor package according to an example embodiment.
Figure 3B:
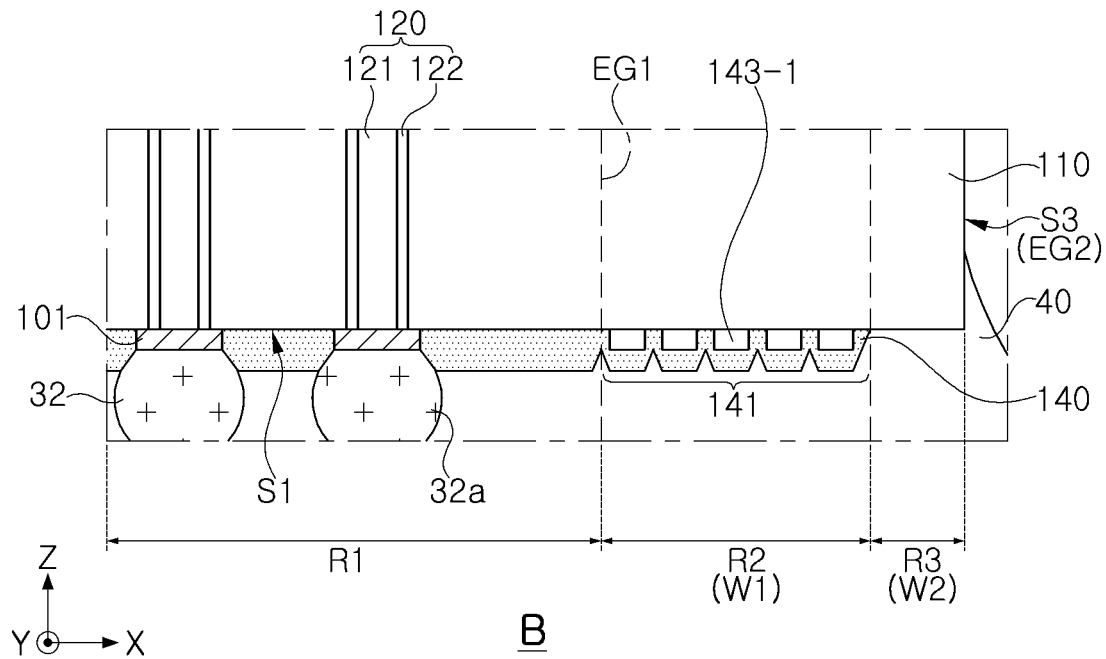

FIGS. 3A and 3B are cross-sectional views of a semiconductor package 1000B according to an example embodiment.

Referring to FIGS. 3A and 3B, the semiconductor package 1000B may further include a first dummy pattern 143-1 corresponding to the first embossed pattern 141 of FIG. 1B. Dummy patterns as described herein may not be used in device operation or function. An interposer substrate 100 may further include a first dummy pattern 143-1 on a first surface S1 or one surface (or a lower surface) of the interposer substrate 100, and the first dummy pattern 143-1 may be disposed in a second region R2 to be covered with a passivation layer 140. A first embossed pattern 141 of a passivation layer 140 may have a curved shape corresponding or conforming to the first dummy pattern 143-1. The first embossed pattern 141 may be formed using the first dummy pattern 143-1 without an additional process (for example, a photolithography etching process) for forming the first embossed pattern 141. A line width of the first dummy pattern 143-1 (a width of the first dummy pattern 143-1 in an X direction) may be about 0.5 μm or more, and a separation distance between adjacent first dummy patterns 143-1 (a distance between the adjacent first dummy patterns 143-1 in the X direction) may be 0.5 μm or more. For example, the line width of the first dummy pattern 143-1 may be within the range of 0.5 μm to 5 μm, and the separation distance between the adjacent first dummy patterns 143-1 may be within the range of 0.5 μm to 5 μm. A height of the passivation layer 140, covering the first dummy pattern 143-1, may be about 1.5 μm or more. For example, the height of the passivation layer 140 may be within the range of 1.5 μm to 5 μm. The height of the passivation layer 140 may be defined as a height from a first surface S1 of a semiconductor substrate 110 to a convex portion of the first embossed pattern 141.

The first dummy pattern 143-1 may be substantially coplanar with a bump pad 101. The first dummy pattern 143-1 may include the same metal as the bump pad 101. A thickness of the first dummy pattern 143-1 may be substantially the same as a thickness of the bump pad 101. The first dummy pattern 143-1 may have a dot-pattern shape or a line-pattern shape.

Figure 4A:
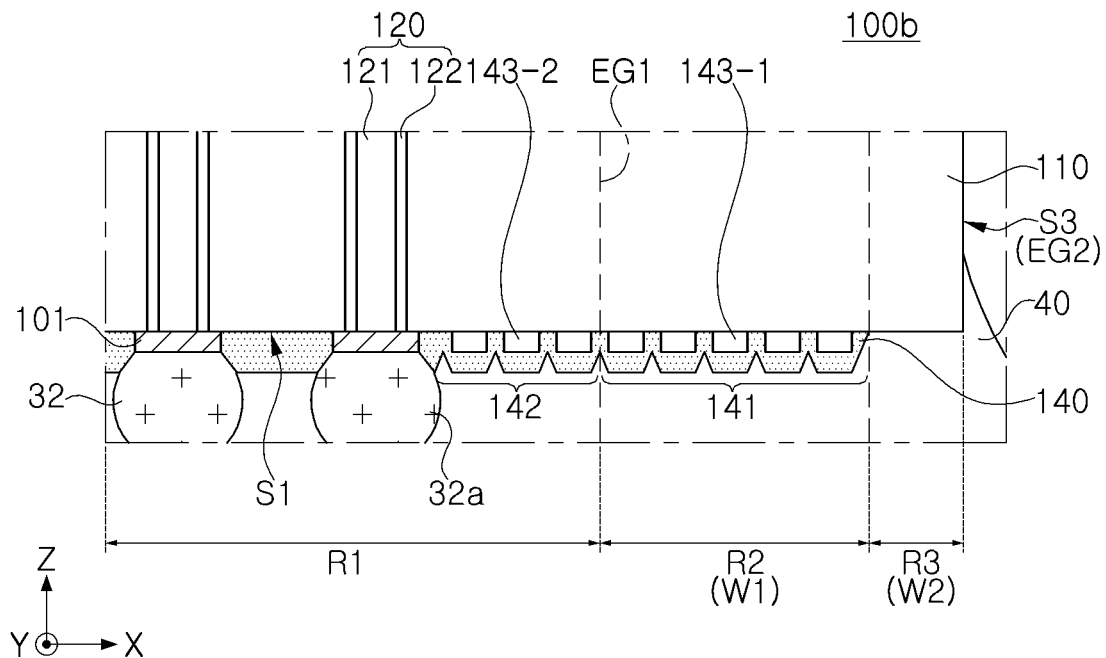
FIGS. 4A and 4B are cross-sectional views illustrating modified examples of some components in the semiconductor package of FIG. 3A.
Figure 4B:
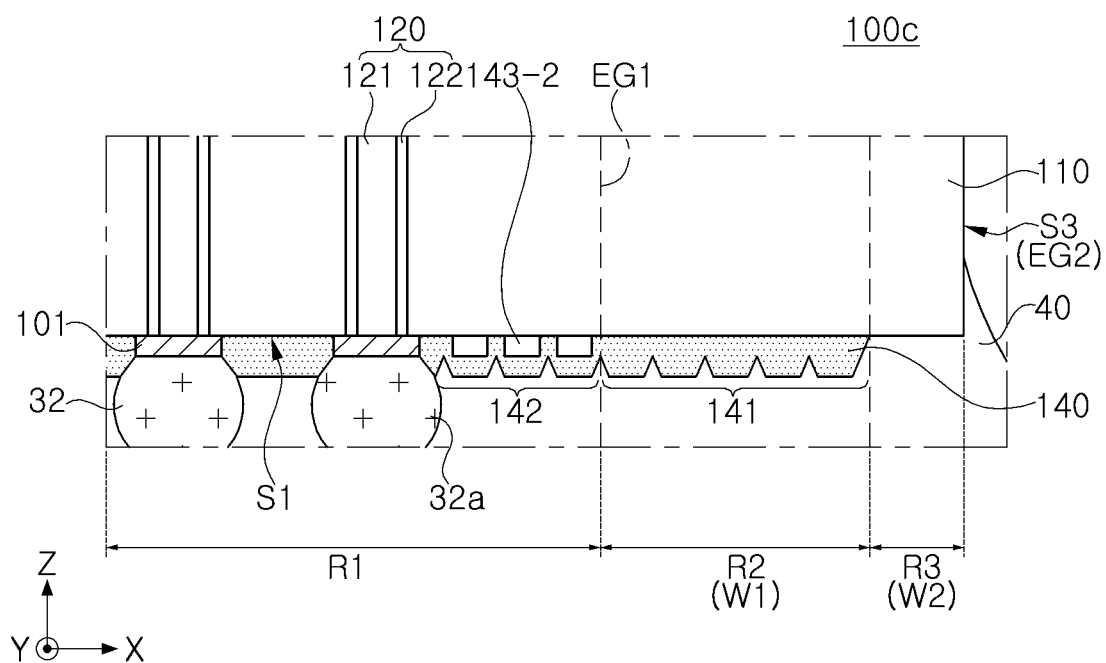

FIGS. 4A and 4B are cross-sectional views illustrating modified examples of some components in the semiconductor package 1000B of FIG. 3A. FIGS. 4A and 4B illustrate a modified example of an interposer substrate 100 in the semiconductor package 1000B of FIG. 3A.

Referring to FIG. 4A, a modified interposer substrate 100b may include a passivation layer 140 further including a second dummy pattern 143-2. The interposer substrate 100b may further include a second dummy pattern 143-2 on a first surface S1 of a semiconductor substrate 110 or one surface (or a lower surface) of the interposer substrate 100b, and the pattern 143-2 may be covered with the passivation layer 140. The second dummy pattern 143-2 may be disposed between an edge or boundary EG1 of a first region R1 and an outermost connection bump 32a. The second dummy pattern 143-2 may be disposed outside or adjacent a periphery of the outermost connection bump 32a within the first region R1. The second embossed pattern 142 may have a curved shape corresponding or conforming to a surface of the second dummy pattern 143-2. A line width of the second dummy pattern 143-2 (a width of the second dummy pattern 43-2 in an X direction) may be about 0.5 μm or more, and a separation distance between adjacent second dummy patterns 143-2 (a distance between the adjacent second dummy patterns 143-2 in the X direction) may be about 0.5 μm or more. For example, the line width of the second dummy pattern 143-2 may be within the range of 0.5 μm to 5 μm, and the separation distance between the adjacent second dummy patterns 143-2 may be within the range of 0.5 μm to 5 μm. A height of the passivation layer 140, covering the second dummy pattern 143-2, may be about 1.5 μm or more. For example, the height of the passivation layer 140 may be within the range of 1.5 μm to 5 μm. The height of the passivation layer 140 may be defined as a height from the first surface S1 of the semiconductor substrate 110 to a convex portion of the second embossed pattern 142.

Referring to FIG. 4B, a modified interposer substrate 100c may include a passivation layer 140 including first and second embossed patterns 141 and 142 and a second dummy pattern 143-2. In the present modified example, a dummy pattern in a second region R2 corresponding to a scribe lane region may be omitted, but the present disclosure is not limited thereto. The first and second embossed patterns 141 and 142 and first and second dummy patterns 143-1 and 143-2 may be combined in various forms and are not limited to the examples shown. Accordingly, referring to FIGS. 1B, 2, 3B, 4A, and 4B, in an example embodiment, the interposer substrate 100 may include the plurality of bump pads 101 disposed on the first surface S1, the dummy patterns 143-1 and/or 143-2 disposed on an exterior or periphery of the plurality of bump pads 101 on the first surface S1, the plurality of through-vias 120 electrically connecting the interconnection structure 132 and the plurality of bump pads 101 to each other through the semiconductor substrate 110, and the passivation layer 140 covering the plurality of bump pads 101 and the plurality of dummy patterns 143-1 and/or 143-2. The passivation layer 140 may be spaced apart from the edge EG2 of the interposer substrate 100 by a predetermined distance, and may have embossed patterns 141 and/or 142 that are curved along or substantially conforming to surfaces of the plurality of dummy patterns 143-1 and/or 143-2. The plurality of dummy patterns 143-1 and/or 143-2 may be electrically insulated from the plurality of bump pads 101.

Figure 5A:
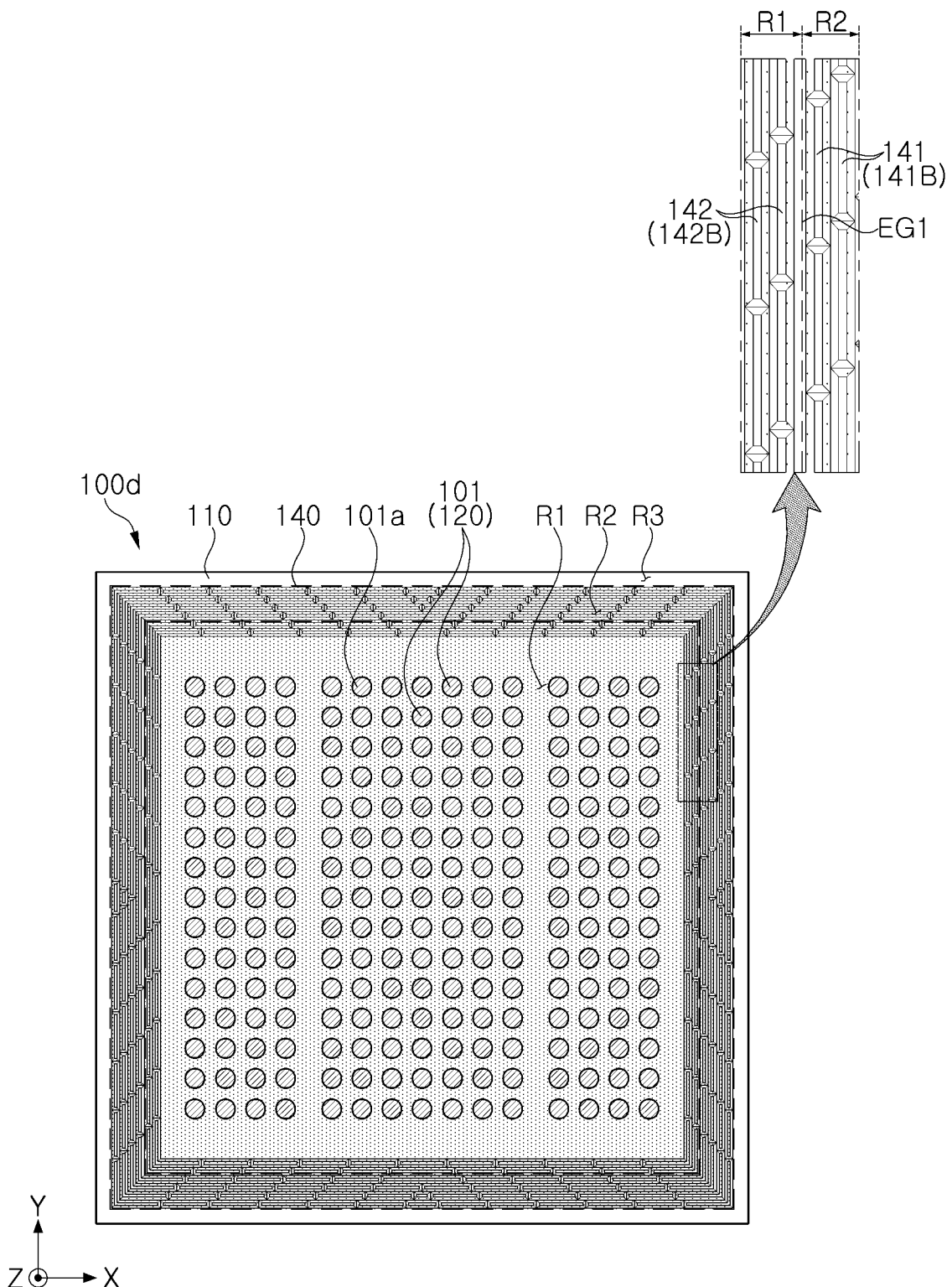
FIGS. 5A to 5C are plan views illustrating interposer substrates of semiconductor packages according to various example embodiments.
Figure 5B:
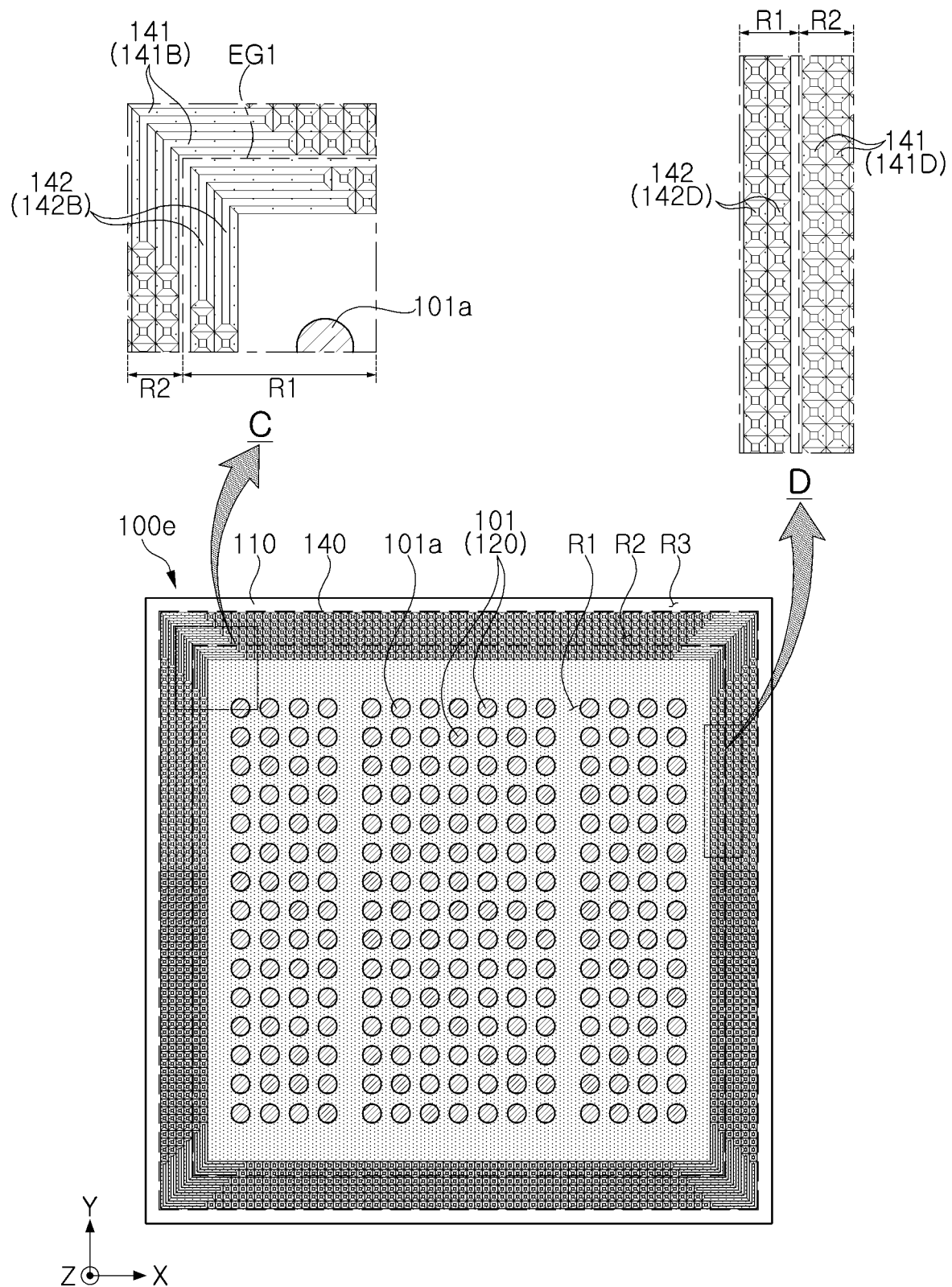
Figure 5C:
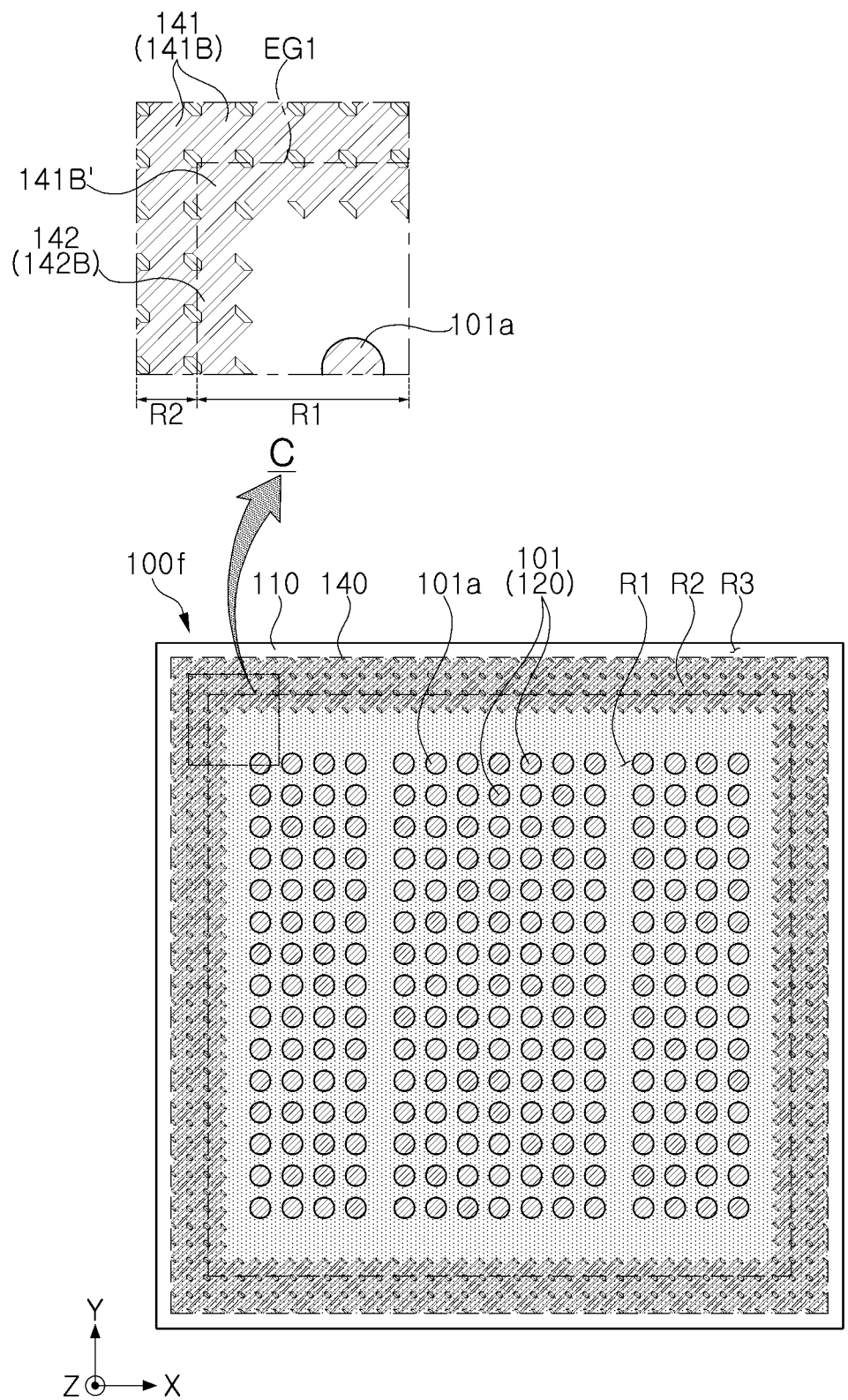

FIGS. 5A to 5C are plan views illustrating interposer substrates of semiconductor packages according to various example embodiments.

Referring to FIGS. 5A to 5C, in various example embodiments, first and second embossed patterns 141 and 142 may be provided in such a manner that a plurality of bar structures and/or a plurality of dot structures, each having a predetermined length, are combined to surround an exterior or periphery of a plurality of bump pads 101 or a plurality of through-vias 120.

For example, as illustrated in FIG. 5A, in an interposer substrate 100d according to an example embodiment, first and second embossed patterns 141 and 142 may be provided in such a manner that a plurality of bar structures surround exteriors or perimeters of a first region R1 and a plurality of bump pads 101 (or outermost bump pads 101a). The plurality of bar structures 141B and 142B may be formed to extend along an edge or boundary EG1 of the first region R1.

For example, as illustrated in FIG. 5B, in an interposer substrate 100e according to an example embodiment, first and second embossed patterns 141 and 142 may be provided in such a manner that a plurality of bar structures 141B and 142B and a plurality of dot structures 141D and 142D are combined to surround exteriors of a first region R1 and a plurality of bump pads 101 (or outermost bump pads 101a). The plurality of bar structures 141B and 142B may be disposed in a corner portion C, and the plurality of dot structures 141D and 142D may be disposed in a corner portion D. The plurality of bar structures 141B and 142B may be bent or angled at the corner portion C.

For example, as illustrated in FIG. 5C, in an interposer substrate 100f according to an example embodiment, first and second embossed patterns 141 and 142 may include a plurality of bar structures 141B and 142B arranged parallel to each other. In an example embodiment, some bar structures 141B' may be disposed to overlap a first region R1 and a second region R2. In example embodiments, bar structures 141B and 142B and dot structures 141D and 142D may be combined in various forms other than the shapes illustrated in the examples of FIGS. 5A to 5C.

Figure 6:
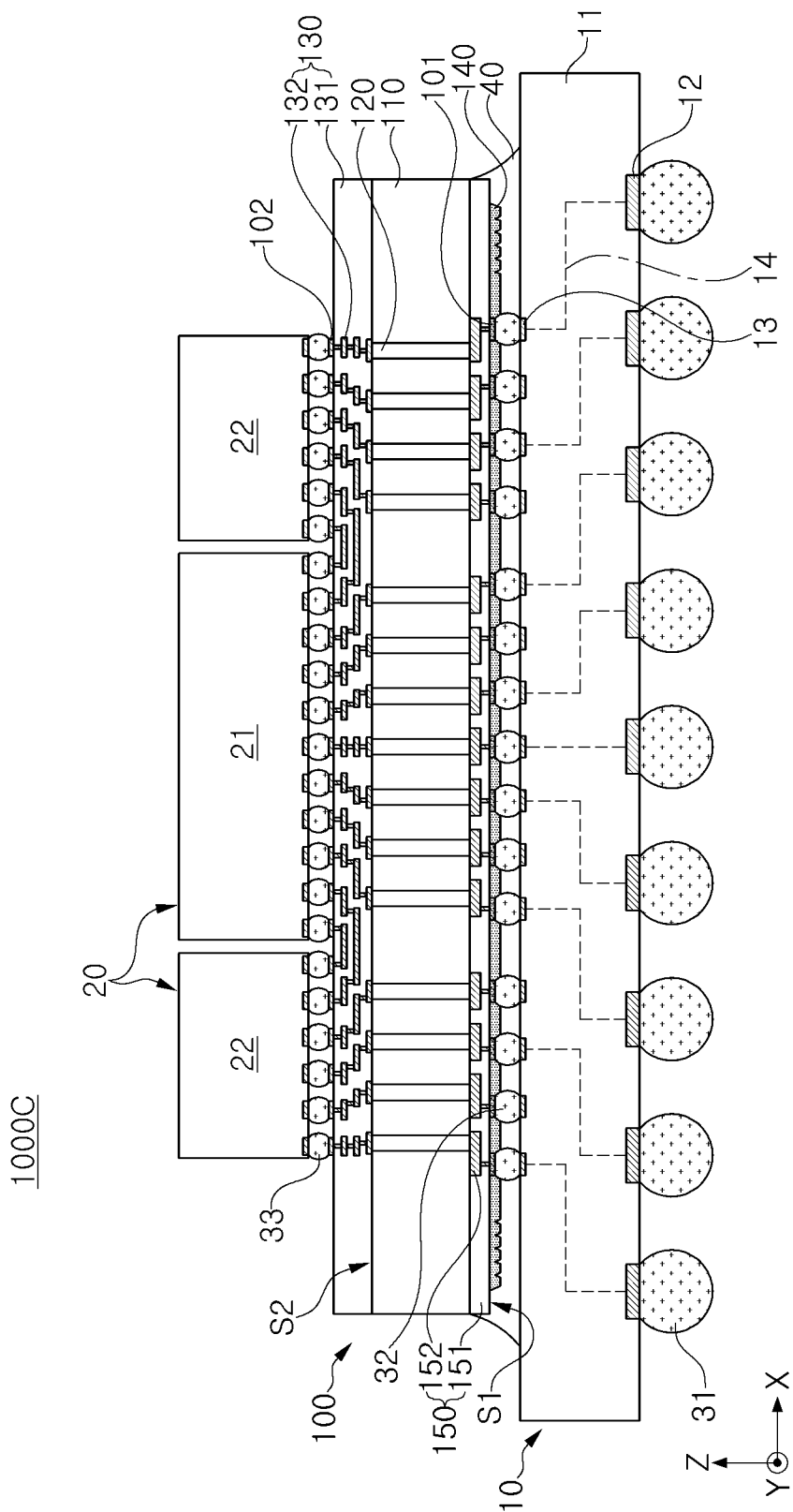
FIG. 6 is a cross-sectional view of a semiconductor package according to an example embodiment.

FIG. 6 is a cross-sectional view of a semiconductor package 1000C according to an example embodiment.

Referring to FIG. 6, the semiconductor package 1000C may include a first interconnection region 130, disposed on a front side of a semiconductor substrate 110, and a second interconnection region 150 disposed on a bottom side (or a back side) of the semiconductor substrate 110. The second interconnection region 150 may include a second interlayer insulating layer 151 and a third interconnection structure 152. The second interlayer insulating layer 151 may be disposed on a first surface S1 of the semiconductor substrate 110, and may include a silicon oxide or a silicon nitride. The third interconnection structure 152 may include a single-metal interconnection. However, the present disclosure is not limited thereto, and the third interconnection structure 152 may include fewer or more metal interconnections and contact vias than those illustrated in the drawing. The contact via may connect the third interconnection structure 152 and a lower bump pad 101. A through-via 120 may electrically connect a second interconnection structure 132 and the third interconnection structure 152 to each other. The second interconnection structure 132 and the third interconnection structure 152 may substantially redistribute connection terminals of the semiconductor chip 20.

Figure 7:
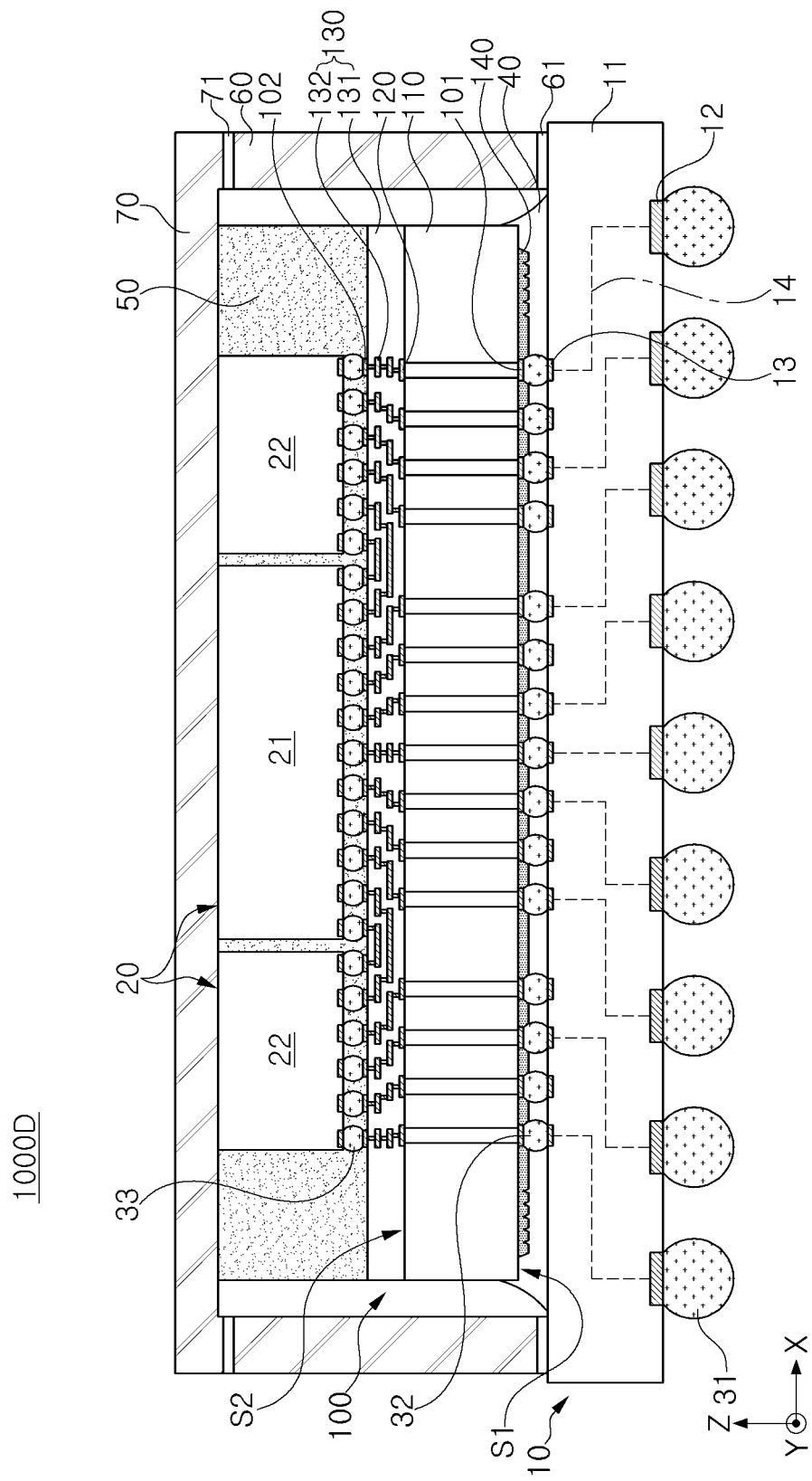
FIG. 7 is a cross-sectional view of a semiconductor package according to an example embodiment.

FIG. 7 is a cross-sectional view of a semiconductor package 1000D according to an example embodiment.

Referring to FIG. 7, the semiconductor package 1000D may further include a molding member 50 on an interposer substrate 100, a stiffener 60 on a base substrate 10, and a heat sink 70. The molding member 50 may encapsulate at least a portion of the plurality of semiconductor chips 20 on an interposer substrate 100. The molding member 50 may include, for example, a thermosetting resin such as an epoxy resin, a thermoplastic resin such as a polyimide resin, prepreg including an inorganic filler and/or a glass fiber, Ajinomoto Build-up Film (ABF), FR-4, bismaleimide triazine (BT), epoxy molding compound (EMC), or the like. The molding member 50 may further include an underfill resin filling a space between an interposer substrate 100 and the semiconductor chips 20. In this case, the underfill resin may be a portion of the molding member 50 formed in a molded underfill (MUF) manner.

The stiffener 60 may be disposed on the base substrate 10 to control warpage of the package. The stiffener 60 may be disposed on the base substrate 10 to continuously or discontinuously surround side surfaces of the semiconductor chips 20. The stiffener 60 may be configured to include a metal such as aluminum (Al), silver (Ag), tin (Sn), gold (Au), nickel (Ni), lead (Pb), titanium (Ti), or alloys thereof. The stiffener 60 may be attached to the base substrate 10 by a bonding member 61. The bonding member 61 may be, for example, a thermally conductive adhesive tape, a thermally conductive grease, a thermally conductive adhesive, or the like.

The heat sink 70 may be disposed on the semiconductor chip 20 to dissipate heat, generated from the semiconductor chip 20, to the outside of or external to the package 1000D. The heat sink 70 may be disposed on the stiffener 60 and may be in contact with the semiconductor chips 20. The heat sink 70 may be in the form of a plate covering an upper surface of the semiconductor chip 20. The heat sink 70 may include a metal such as gold (Au), silver (Ag), or copper (Cu), or a conductive material such as graphite or graphene. The heat sink 70 may be attached to the stiffener 60 or the semiconductor chip 20 by an adhesive member 71 similar to the stiffener 60.

Figure 8:
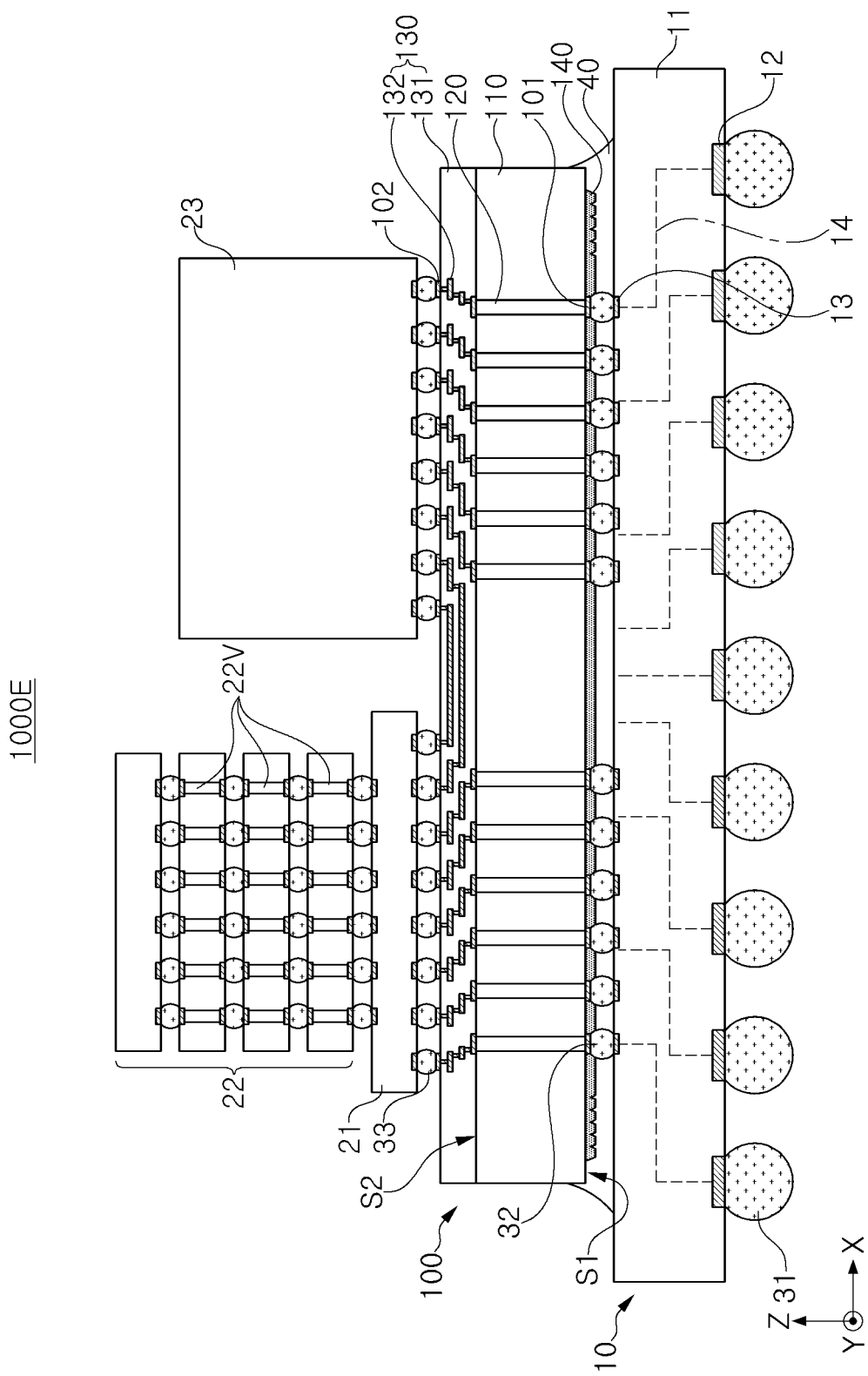
FIG. 8 is a cross-sectional view of a semiconductor package according to an example embodiment.

FIG. 8 is a cross-sectional view of a semiconductor package 1000E according to an example embodiment.

Referring to FIG. 8, the semiconductor package 1000E may include first to third semiconductor chips 21, 22, and 23 including different types of integrated circuits. The first semiconductor chip 21 may include a logic circuit communicating with a plurality of second semiconductor chips 22 and the third semiconductor chip 23.

The plurality of second semiconductor chips 22 may be stacked in a vertical direction (a Z direction), and may be connected to each other by through-silicon vias (TSV) 22V. The plurality of second semiconductor chips 22 may include a volatile memory device such as a DRAM, a static RAM (SRAM), or the like, and a nonvolatile memory device such as a PRAM, an MRAM, a RRAM, a flash memory device, or the like. In the plurality of second semiconductor chips 22, the first semiconductor chip 21 may store or output data based on a signal.

The third semiconductor chip 23 may be at least one of a central processing unit (CPU), a graphics processing unit (GPU), and a system-on-chip (SoC), and may be connected to communicate with the first semiconductor chip 21. The third semiconductor chip 23 may be disposed below the first semiconductor chip 21 in some embodiments.

FIGS. 9A to 9G are schematic cross-sectional views illustrating a method of manufacturing some components in the semiconductor package 1000A of FIG. 1B. FIGS. 9A to 9G illustrate a method of manufacturing the interposer substrate 100 of FIG. 1B.

Figure 9A:
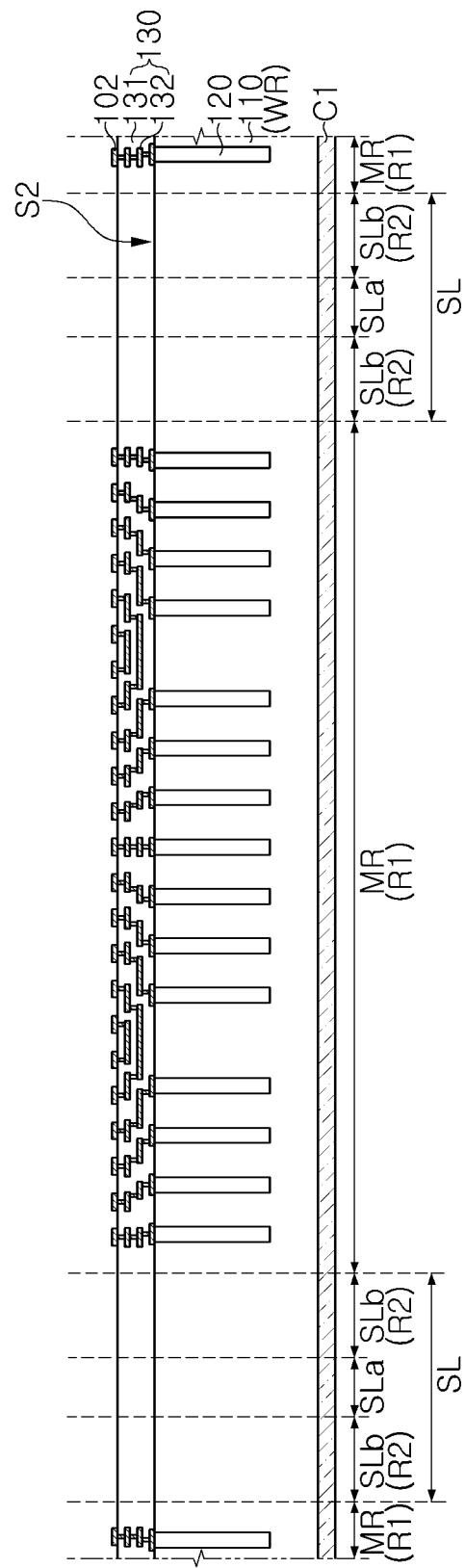

Referring to FIG. 9A, a through-via 120, an interconnection region 130, and an upper bump pad 102 may be formed on a semiconductor wafer WR on the first carrier C1. The semiconductor wafer WR may have a plurality of main regions MR or first regions R1 divided or separated by scribe lane regions SL, each including a touch region SLa and a non-touch region SLb. The through-via 120 may extend inwardly of or into the semiconductor substrate 110 from a second surface S2 of a semiconductor substrate 110 or the semiconductor wafer WR. The through-via 120 may include a conductive barrier layer surrounding a cylindrical side surface, a via insulating layer, or the like. The via insulating layer may include an oxide, a nitride, a carbide, a polymer, or combinations thereof.

The interconnection region 130 may include an interlayer insulating layer 131 and an interconnection structure 132. The interlayer insulating layer 131 may include a silicon oxide. The interconnection structure 132 may include a multi-metal interconnection and a contact via. An upper bump pad 102 may be formed on a surface of the interconnection region 130. The interconnection structure 132 may electrically connect the upper bump pad 102 and the through-via 120 to each other. A portion of the interconnection structure 132 may interconnect the upper bump pads 102. The through-via 120 and the interconnection region 130 may be formed by repeatedly performing a photolithography process, an etching process, a plating process, and a polishing process.

Figure 9B:
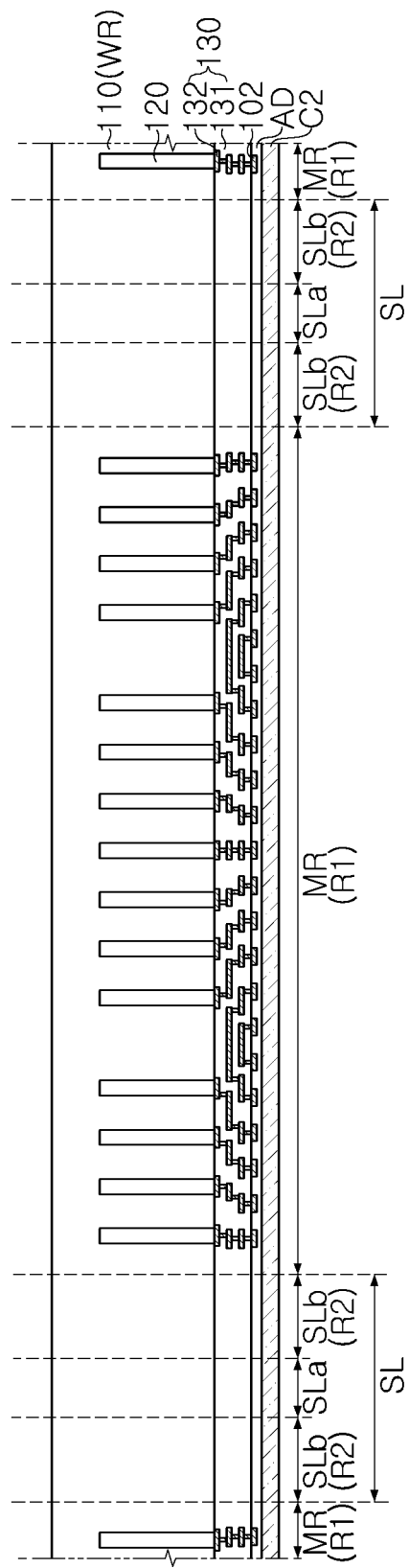

Referring to FIG. 9B, the semiconductor wafer WR of FIG. 9A may be inverted and then attached to a second carrier C2. An adhesive layer AD may be present on a surface of the second carrier C2. The semiconductor wafer WR may be attached to the second carrier C2 such that the upper bump pad 102 is embedded in the adhesive layer AD.

Referring to FIG. 9C, a portion of the semiconductor wafer WR may be removed to expose the through-via 120, and a lower bump pad 101 may be formed on a first surface S1 of the semiconductor wafer WR. A portion of the semiconductor wafer WR may be removed using a chemical mechanical polishing (CMP) process, an etch-back process, or a combination thereof. The lower bump pad 101 may be formed using a photolithography process and a plating process. The semiconductor wafer WR may be removed to expose the through-via 120, rather than the first surface S1. In this case, a protruding side surface of the through-via 120 may be surrounded by a silicon oxide layer or a silicon nitride layer.

Figure 9D:
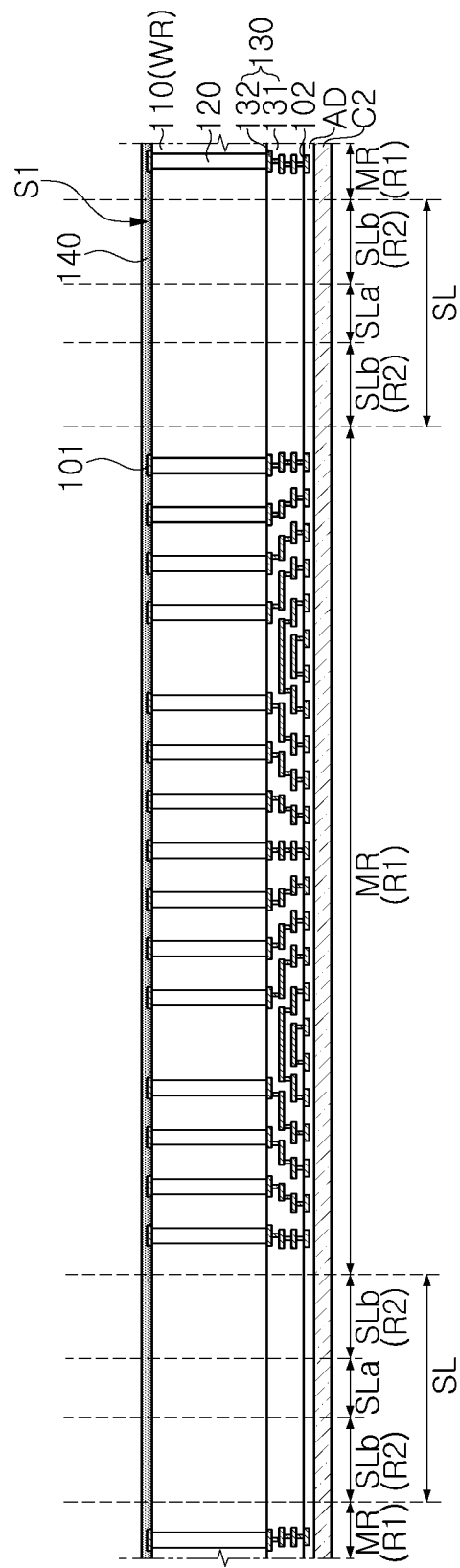

Referring to FIG. 9D, a passivation layer 140 may be formed on the first surface S1 of the semiconductor wafer WR. The passivation layer 140 may be formed of an insulating polymer. The passivation layer 140 may be formed by, for example, a spin coating process or a spraying process. A portion of the passivation layer 140 may be removed using a photolithography process, or the like, to expose the lower bump pad 101.

Figure 9E:
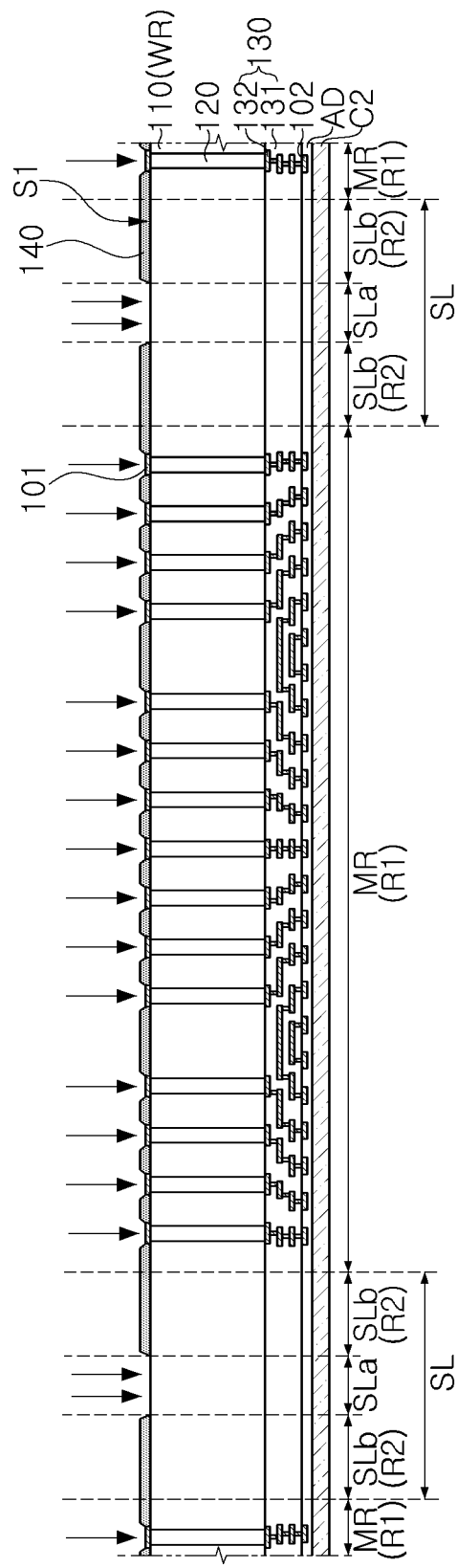

Referring to FIG. 9E, a portion of the passivation layer 140 of FIG. 9D may be removed to expose the lower bump pad 101 and the touch region SLa. The passivation layer 140 may be removed using a photolithography process, or the like. A portion of the passivation layer 140 on the touch region SLa in direct contact with a sawing blade in the sawing process may be removed to reduce or prevent cracking from occurring in the sawing process.

Figure 9F:
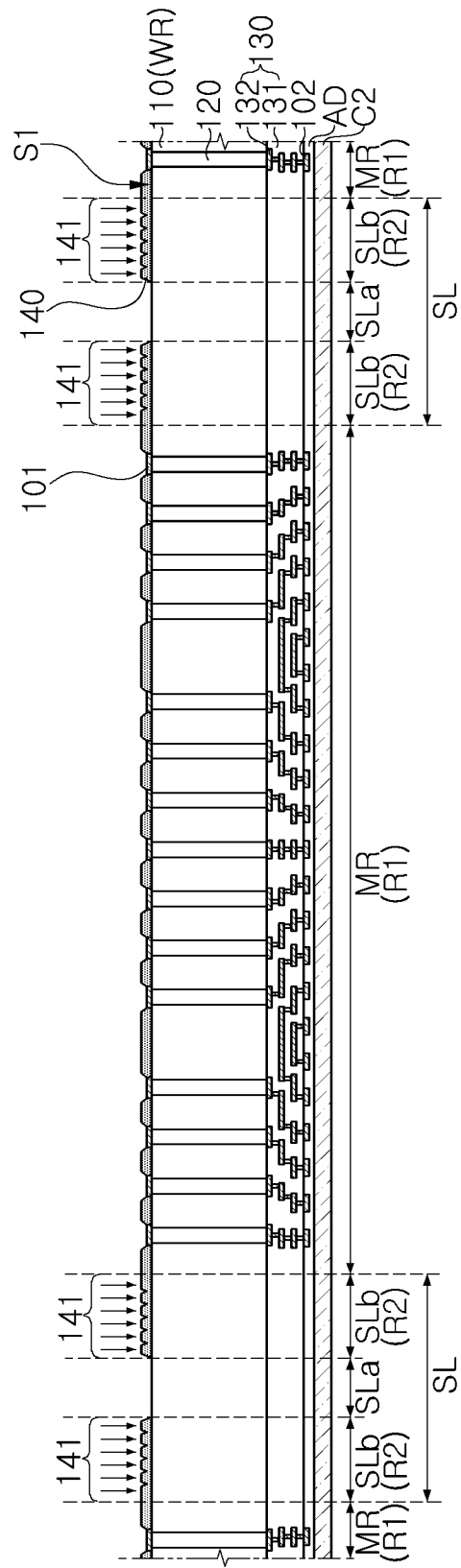

Referring to FIG. 9F, a surface of the passivation layer 140 on the non-touch region SLb may be processed to form an embossed pattern 141. The embossed pattern 141 may be formed using a photolithography process, or the like. The embossed pattern 141 may be formed on an external side or periphery of the main region MR to block a path of cracking propagating to the main region MR. In another embodiment, an embossed pattern extending along an edge of the main region MR may be further formed.

Figure 9G:
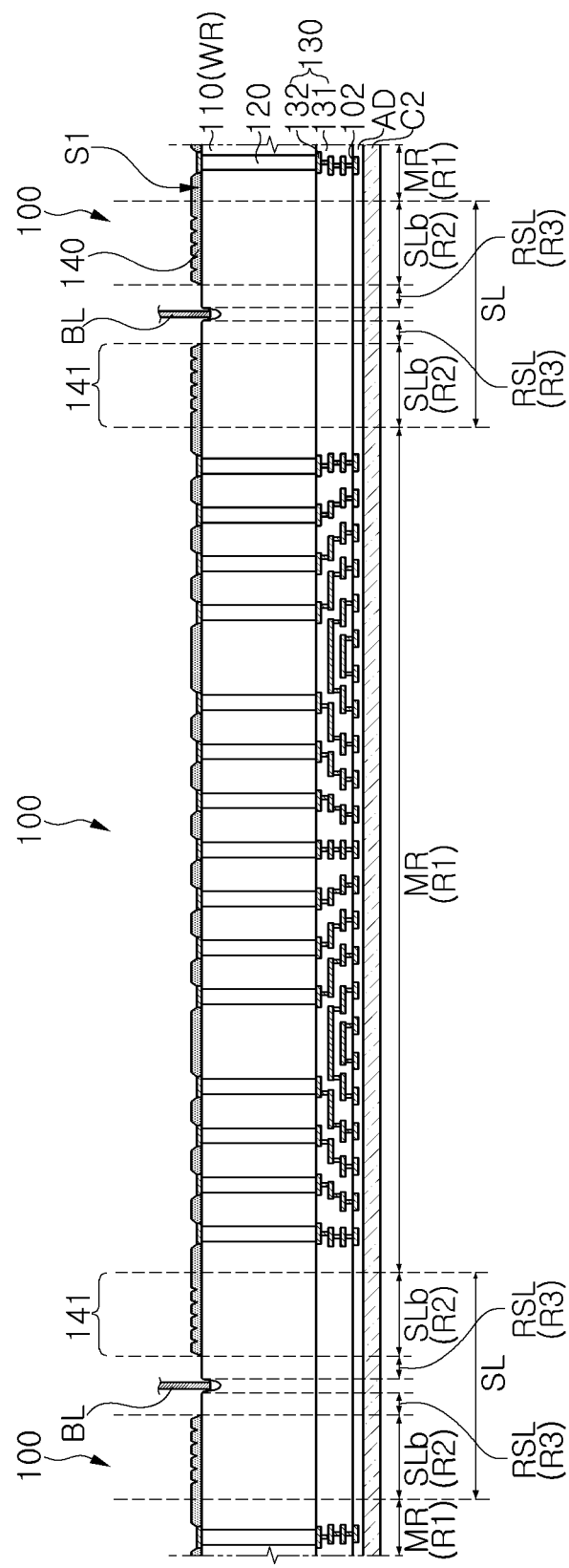

Referring to FIG. 9G, the semiconductor wafer WR may be cut along a scribe lane SL using the sawing blade BL. The sawing blade BL may cut the semiconductor wafer WR within the touch region SLa of the scribe lane SL. After the sawing process, a residual region RSL, unremoved by the sawing blade BL, may be present on one side of the non-touch region SLb. An individual interposer substrate 100, separated after the sawing process, may include a first region R1 corresponding to the main region MR, a second region R2 corresponding to the non-touch region SLb, and a third region R3 corresponding to the residual region RSL.

As described above, an embossed pattern may be introduced into a passivation layer, covering a back side of an interposer substrate, to provide a semiconductor package having improved reliability.

While example embodiments have been shown and described above, it will be apparent to those skilled in the art that modifications and variations could be made without departing from the scope of the present inventive concept as defined by the appended claims.

What is claimed is:

1. A semiconductor package comprising:
   a base substrate comprising a first interconnection structure;
   an interposer substrate comprising a semiconductor substrate having a first surface facing the base substrate and a second surface opposing the first surface, an interconnection region on the second surface and comprising a second interconnection structure, a through-via extending through the semiconductor substrate and electrically connecting the second interconnection structure to the first interconnection structure, and a passivation layer on at least a portion of the first surface;
   a plurality of connection bumps between the base substrate and the interposer substrate and electrically connecting the through-via to the first interconnection structure;
   an underfill resin in a space between the base substrate and the interposer substrate; and
   a first semiconductor chip and a second semiconductor chip on the interconnection region of the interposer substrate and electrically connected to each other by the second interconnection structure,
   wherein the interposer substrate comprises a first region comprising the plurality of connection bumps, a second region adjacent a periphery of the first region, and a third region adjacent a periphery of the second region,
   the passivation layer is in the first region and the second region and comprises a first embossed pattern in the second region, and
   the third region is free of the passivation layer.

2. The semiconductor package of claim 1, wherein the second region and the third region are free of the connection bumps and the second region has a width greater than a width of the third region.

3. The semiconductor package of claim 1, wherein the third region is within a first distance from an edge of the interposer substrate, and the third region is between the second region and the edge of the interposer substrate.

4. The semiconductor package of claim 3, wherein the first distance is about 10 micrometers (μm) or more.

5. The semiconductor package of claim 1, wherein the third region is in direct contact with the underfill resin.

6. The semiconductor package of claim 1, wherein a surface of the first embossed pattern is in direct contact with the underfill resin.

7. The semiconductor package of claim 1, wherein the passivation layer on the first surface is spaced apart from an edge of the interposer substrate by about 10 μm or more.

8. The semiconductor package of claim 1, wherein the interposer substrate further comprises a first dummy pattern on the first surface of the semiconductor substrate with the passivation layer thereon,
   the first dummy pattern is in the second region, and
   the first embossed pattern is curved to conform to the first dummy pattern.

9. The semiconductor package of claim 1, wherein the periphery of the first region extends beyond an outermost connection bump, among the plurality of connection bumps, by a predetermined distance, and
   the passivation layer further comprises a second embossed pattern in the periphery of the first region between the second region and the outermost connection bump.

10. The semiconductor package of claim 9, wherein the interposer substrate further comprises a second dummy pattern on the first surface of the semiconductor substrate with the passivation layer thereon,
    the second dummy pattern is in the periphery of the first region between the second region and the outermost connection bump, and
    the second embossed pattern is curved to conform to the second dummy pattern.

11. The semiconductor package of claim 1, wherein the interposer substrate further comprises a third interconnection structure on the first surface of the semiconductor substrate, and
    the through-via electrically connects the second interconnection structure to the third interconnection structure.

12. A semiconductor package comprising:
    an interposer substrate having a first region comprising a plurality of through-vias, a second region adjacent a periphery of the first region, and a third region adjacent a periphery of the second region;
    a passivation layer on a first surface of the interposer substrate in the second region, a surface of the passivation layer comprising a first embossed pattern in the second region; and
    a plurality of semiconductor chips on a second surface of the interposer substrate opposite the first surface,
    wherein the second region is spaced apart from an edge of the interposer substrate, and the third region is between the second region and the edge of the interposer substrate.

13. The semiconductor package of claim 12, wherein the first embossed pattern comprises a shape in which a plurality of bar structures having a predetermined length and/or a plurality of dot structures surround the first region.

14. The semiconductor package of claim 12, further comprising:
    a first dummy pattern on the first surface of the interposer substrate in the second region with the passivation layer thereon,
    wherein the first embossed pattern is curved to conform to the first dummy pattern.

15. The semiconductor package of claim 12, wherein the passivation layer is on the first surface in the first region, and wherein the surface of the passivation layer further comprises a second embossed pattern within the first region and adjacent a periphery of the plurality of through-vias.

16. The semiconductor package of claim 15, wherein the second embossed pattern comprises a shape in which a plurality of bar structures having a predetermined length and/or a plurality of dot structures surround the periphery of the plurality of through-vias.

17. The semiconductor package of claim 15, further comprising:
    a second dummy pattern on the first surface of the interposer substrate in the first region with the passivation layer thereon,
    wherein the second embossed pattern is curved to conform to the second dummy pattern.

18. A semiconductor package comprising:
    an interposer substrate comprising a semiconductor substrate having a first surface and a second surface opposing the first surface, an interconnection region on the second surface and comprising an interconnection structure, a plurality of bump pads on the first surface, a plurality of dummy patterns adjacent a periphery of the plurality of bump pads on the first surface, a plurality of through-vias extending through the semiconductor substrate and electrically connecting the interconnection structure to the plurality of bump pads, and a passivation layer on the plurality of bump pads and the plurality of dummy patterns; and
    a first semiconductor chip and a second semiconductor chip on the interposer substrate and electrically connected to each other by the interconnection structure,
    wherein the passivation layer is spaced apart from an edge of the interposer substrate by a predetermined distance and comprises an embossed pattern that is curved along surfaces of the plurality of dummy patterns.

19. The semiconductor package of claim 18, wherein the passivation layer is spaced apart from the edge of the interposer substrate by about 10 μm or more.

20. The semiconductor package of claim 18, wherein a line width of each of the plurality of dummy patterns in a first direction is about 0.5 μm or more, and
    a separation distance between immediately adjacent dummy patterns, among the plurality of dummy patterns, in the first direction is about 0.5 μm or more.

* * * * *